(12) United States Patent
Jung et al.

(10) Patent No.: US 12,426,178 B2
(45) Date of Patent: Sep. 23, 2025

(54) ELECTRONIC DEVICE COMPRISING FLEXIBLE DISPLAY

(71) Applicant: Samsung Electronics Co., Ltd., Suwon-si (KR)

(72) Inventors: Minsu Jung, Suwon-si (KR); Jongchul Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 222 days.

(21) Appl. No.: 18/144,126

(22) Filed: May 5, 2023

(65) Prior Publication Data
US 2023/0276584 A1    Aug. 31, 2023

Related U.S. Application Data

(63) Continuation of application No. PCT/KR2021/015619, filed on Nov. 1, 2021.

(30) Foreign Application Priority Data
Nov. 5, 2020   (KR) .................. 10-2020-0147044

(51) Int. Cl.
*H05K 5/02*        (2006.01)
*G06F 1/16*        (2006.01)

(52) U.S. Cl.
CPC ......... *H05K 5/0217* (2013.01); *G06F 1/1652* (2013.01)

(58) Field of Classification Search
CPC ... H05K 5/0217; G06F 1/1624; G06F 1/1637; G06F 1/1652; G06F 1/1635; G09F 9/301
See application file for complete search history.

(56) References Cited

U.S. PATENT DOCUMENTS 9,098,241 B1    8/2015   Cho et al.
9,823,697 B2   11/2017   Hsu et al.
(Continued)

FOREIGN PATENT DOCUMENTS

CN   203759605 U   8/2014
CN   108259649 A   7/2018
(Continued)

OTHER PUBLICATIONS

International Search Report and Written Opinion for International Application No. PCT/KR2021/015619; International Filing Date Nov. 1, 2021; Date of Mailing Feb. 23, 2022; 9 pages.
(Continued)

*Primary Examiner* — Sagar Shrestha
(74) *Attorney, Agent, or Firm* — CANTOR COLBURN LLP

(57) ABSTRACT

An electronic device is disclosed. The electronic device can comprise: a housing forming at least a part of the exterior of the electronic device; a rear cover forming the rear surface of the electronic device; a display module loaded on the housing, the display module comprising a bracket including a rotary driving unit and a rear surface, a slide guide arranged on the bracket so as to be movable with respect to the rotary driving unit, and a flexible display arranged to encompass a part of an upper surface of the slide guide, the rotary driving unit, and the rear surface of the bracket; and a battery arranged inside the housing and arranged between the rear cover and a region of the flexible display encompassing the rear surface of the bracket.

15 Claims, 18 Drawing Sheets

(56) References Cited

U.S. PATENT DOCUMENTS

| | | |
|---|---|---|
| 10,742,784 B1 | 8/2020 | Jo et al. |
| 11,315,447 B2 * | 4/2022 | Feng .................... G06F 1/1652 |
| 11,768,519 B2 * | 9/2023 | Feng .................... G06F 1/1637 |
| | | 361/679.27 |
| 11,800,657 B2 * | 10/2023 | Jiang .................... G09F 9/301 |
| 11,914,423 B2 * | 2/2024 | Shin .................... H04M 1/0268 |
| 2013/0058063 A1 | 3/2013 | Obrien |
| 2016/0100478 A1 | 4/2016 | Lee |
| 2017/0196103 A1 | 7/2017 | Cho et al. |
| 2019/0268455 A1 * | 8/2019 | Baek .................... G06F 1/1652 |
| 2019/0310686 A1 | 10/2019 | Lee et al. |
| 2020/0264660 A1 * | 8/2020 | Song .................... G06F 1/1624 |
| 2020/0337159 A1 * | 10/2020 | Yang .................... G06F 1/1652 |
| 2020/0363841 A1 * | 11/2020 | Kim .................... G06F 1/1637 |
| 2021/0044683 A1 * | 2/2021 | He .................... G06F 1/1652 |
| 2021/0181801 A1 * | 6/2021 | Yin .................... G06F 1/1652 |
| 2021/0195008 A1 * | 6/2021 | Lee .................... G06F 1/1652 |
| 2022/0038564 A1 * | 2/2022 | Li .................... G06F 1/1624 |
| 2022/0057843 A1 | 2/2022 | Kim et al. |
| 2022/0253103 A1 * | 8/2022 | Choi .................... G06F 1/1624 |
| 2023/0156105 A1 * | 5/2023 | Feng .................... G06F 1/1652 |
| | | 361/679.01 |
| 2023/0283697 A1 * | 9/2023 | Kim .................... G09F 9/30 |
| | | 455/575.4 |

FOREIGN PATENT DOCUMENTS

| | | |
|---|---|---|
| CN | 111028688 A | 4/2020 |
| CN | 211207842 U | 8/2020 |
| KR | 20160041159 A | 4/2016 |
| KR | 20160141255 A | 12/2016 |
| KR | 20190001864 A | 1/2019 |
| KR | 20190062855 A | 6/2019 |
| KR | 20190077107 A | 7/2019 |
| KR | 20190101605 A | 9/2019 |
| KR | 20190117985 A | 10/2019 |
| WO | 2020211948 A1 | 10/2020 |

OTHER PUBLICATIONS

Korean Notice of Preliminary Rejection corresponding to Application No. KR10-2020-0147044; Dated Jan. 16, 2025.

* cited by examiner

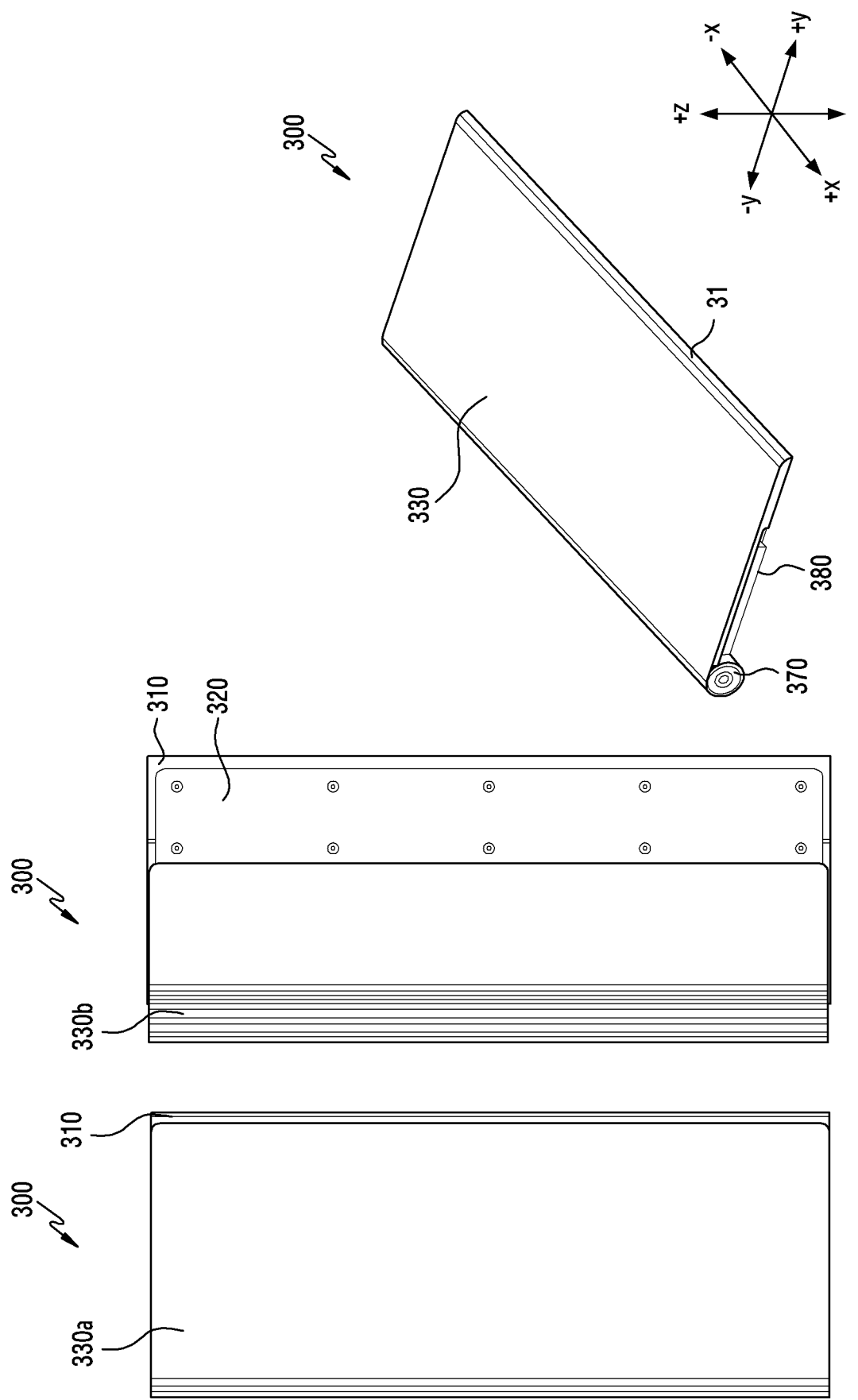

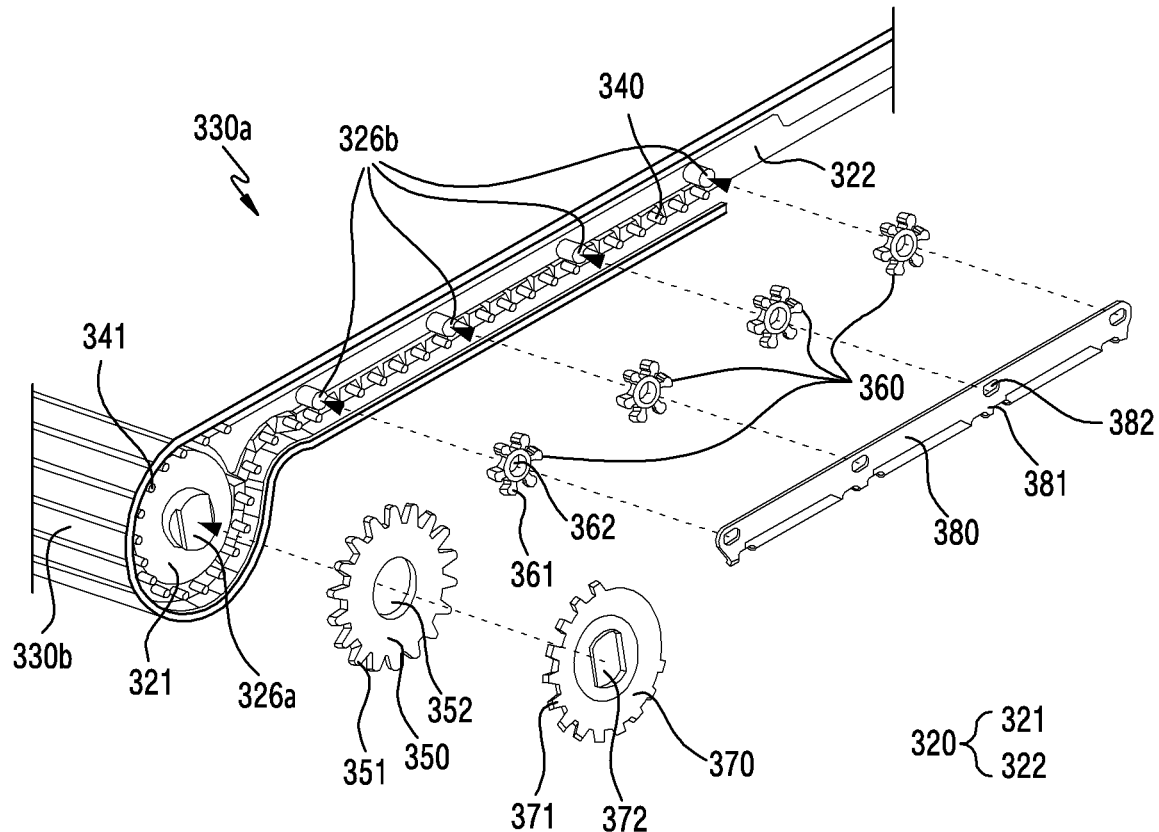
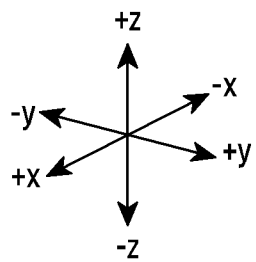
FIG.11

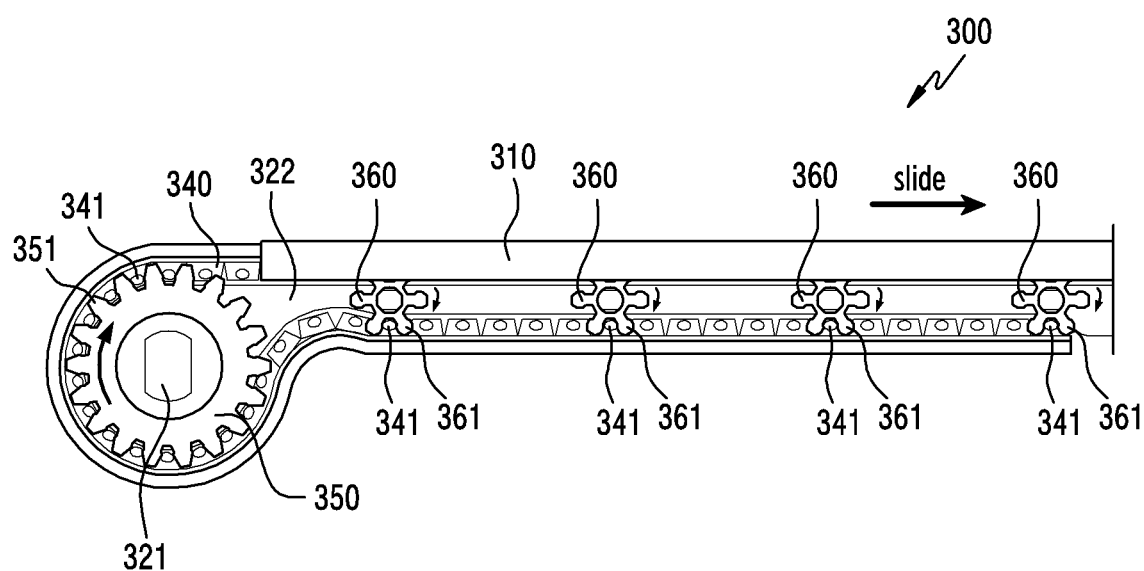
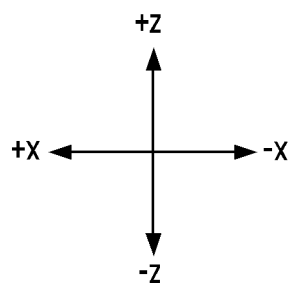
FIG.12

ELECTRONIC DEVICE COMPRISING FLEXIBLE DISPLAY

CROSS-REFERENCE TO RELATED APPLICATIONS

This application is a continuation of International Application No. PCT/KR2021/015619, designating the United States, filed on Nov. 1, 2021, in the Korean Intellectual Property Receiving Office and claiming priority to Korean Patent Application No. 10-2020-0147044, filed on Nov. 5, 2020, in the Korean Intellectual Property Office, the disclosures of which are incorporated by reference herein in their entireties.

TECHNICAL FIELD

Various embodiments disclosed herein relate to a module structure of a flexible display and an electronic device including the same.

BACKGROUND ART

As the functions of electronic devices diversify, there is an increasing demand for an electronic device including a display panel having a larger area to support various functions of the electronic device, such as a media function, in addition to simply miniaturizing or slimming the electronic device.

To satisfy both the demand for miniaturization of electronic devices for improving user portability and the demand for larger displays, recently, a foldable-type electronic device to which a foldable display is applied, a rollable-type (or "sliding type") electronic device to which a rollable display is applied, or the like has been developed.

Among these electronic devices, the rollable-type electronic device means an electronic device in which, when the electronic device is in a closed state, a partial area of the flexible display is rolled on a roller inside the electronic device, and when the electronic device is switched from the closed state to an opened state by a user's operation, the display rolled on the roller is unrolled and slid to the outside of the electronic device to expand a display area.

Through the above-described structure, the rollable-type electronic device is able to provide a wide display area to a user when the electronic device is in the opened state while ensuring portability when the electronic device is in the closed state.

DISCLOSURE OF INVENTION

Technical Problem

Unlike conventional bar-type electronic devices, the rollable-type electronic device may include therein a roller configured to slide a flexible display. The roller requires volume within the electronic device which may make it difficult to ensure sufficient space in which electronic components for executing various functions of the electronic device (e.g., a battery and a printed circuit board) are to be disposed.

In addition, unlike conventional bar-type electronic devices, the rollable-type electronic device may include a display that is disposed across the top and bottom portions in the electronic device, which may make it difficult to assemble electronic components (e.g., a battery and a printed circuit) between the top and bottom portions of the display.

Solution to Problem

Various embodiments according to the disclosure are intended to provide an electronic device in which a flexible display module is placed on one side (e.g., the top portion) of the interior of the electronic device to ensure a separate space in which various electronic components can be disposed and to simplify assembly operations of the electronic device.

An electronic device according to an embodiment may include a housing defining at least a portion of the exterior of the electronic device, a rear surface cover defining the rear surface of the electronic device, a display module seated in the housing, wherein the display module includes a bracket including a rotary drive portion and a rear surface, a slide guide disposed on the bracket to be movable with respect to the rotary drive portion, and a flexible display disposed to surround a top surface of the slide guide, the rotary drive portion, and a portion of the rear surface of the bracket, and a battery disposed between the rear surface cover and an area of the flexible display that surrounds the rear surface of the bracket within the housing.

An electronic device according to an embodiment may include a housing defining at least a portion of the exterior of the electronic device, a rear surface cover defining the rear surface of the electronic device, a display module seated in the housing, wherein the display module includes a bracket including a rotary drive portion and a rear surface, a slide guide disposed on the bracket to be movable with respect to the rotary drive portion, a flexible display disposed to surround a top surface of the slide guide, the rotary drive portion, and a portion of the rear surface of the bracket, and multiple bars attached to an inner surface of the flexible display to support the flexible display and to guide the movement of the flexible display, a printed circuit board disposed between the rear surface cover and an area of the flexible display that surrounds the rear surface of the bracket within the housing, and at least one gear disposed on a side surface of the bracket. The teeth of the at least one gear may be engaged with a bump disposed on each of the multiple bars to drive the display module.

Advantageous Effects of Invention

In an electronic device according to various embodiments of the disclosure, by modularizing a flexible display driven in a sliding manner, a main housing in which various electronic components of the electronic device are disposed and a display module can be independently configured, and assembly and disassembly of the main housing and the display module can be facilitated.

In an electronic device according to various embodiments of the disclosure, by modularizing a flexible display driven in a sliding manner, the efficiency of disposing various electronic components inside the electronic device can be improved.

In addition, various effects directly or indirectly identified through the disclosure may be provided.

BRIEF DESCRIPTION OF DRAWINGS

FIG. 7A is a view illustrating a display module of a rollable electronic device viewed from above according to an embodiment.

FIG. 7B is a view illustrating a display module of a rollable electronic device viewed from below according to an embodiment.

FIG. 7C is a perspective view illustrating a display module of a rollable electronic device according to an embodiment.

FIG. 11 is a perspective view illustrating how gears and gear covers are assembled in a display module according to an embodiment.

FIG. 12 is a view illustrating a driving principle of a display module according to an embodiment.

In connection with the description of the drawings, the same or similar components may be denoted by the same or similar reference numerals.

MODE FOR CARRYING OUT THE INVENTION

Figure 1:
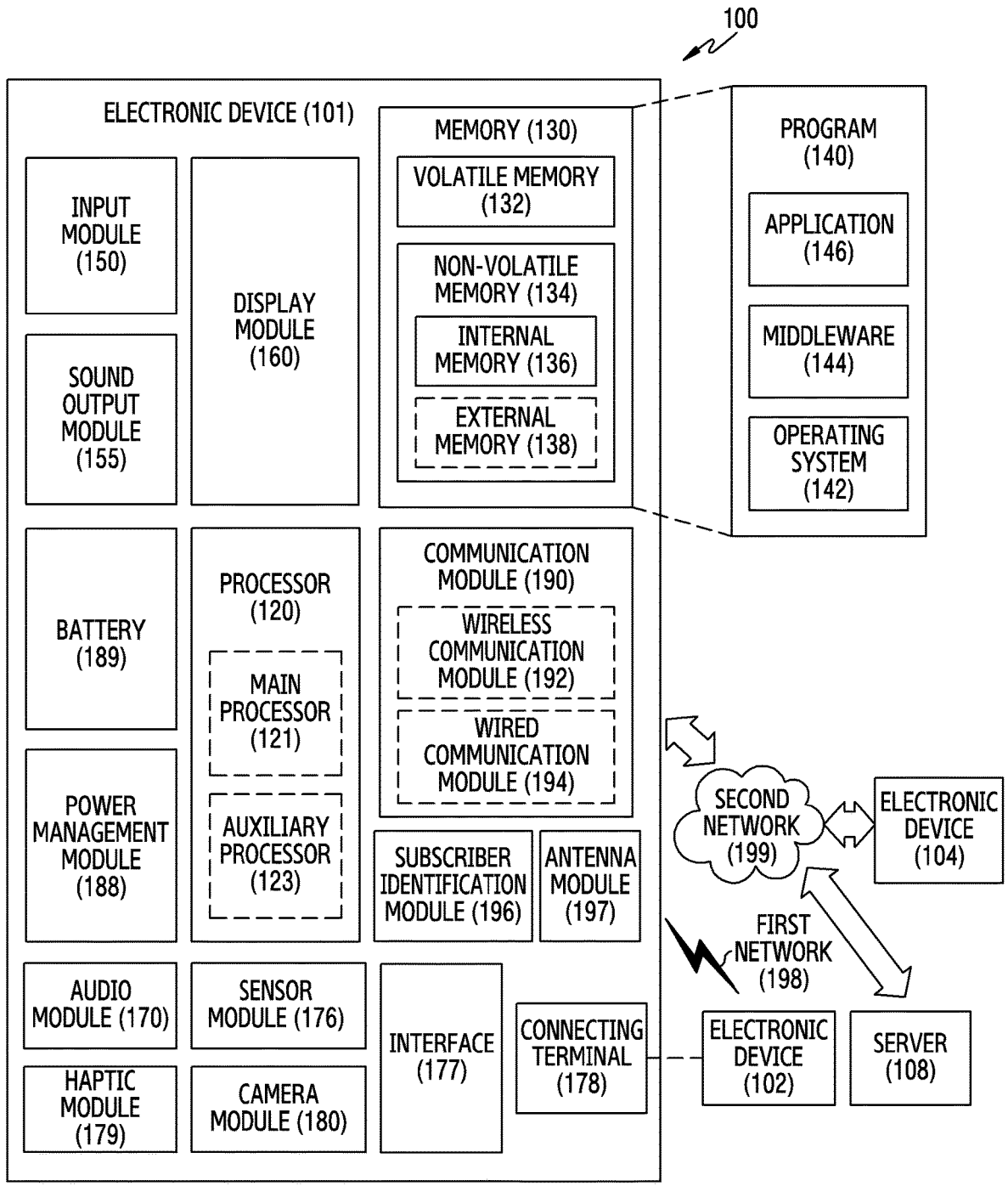
FIG. 1 is a block diagram illustrating an electronic device according to various embodiments in a network environment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber Information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "$1^{st}$" and "$2^{nd}$," or "first" and "second" may be used to simply distinguish a corresponding component from another, and does not limit the components in other aspect (e.g., importance or order). It is to be understood that if an element (e.g., a first element) is referred to, with or without the term "operative" or "communicative", as "coupled with" "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic" "logic block" "part" or "circuit". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transistor" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
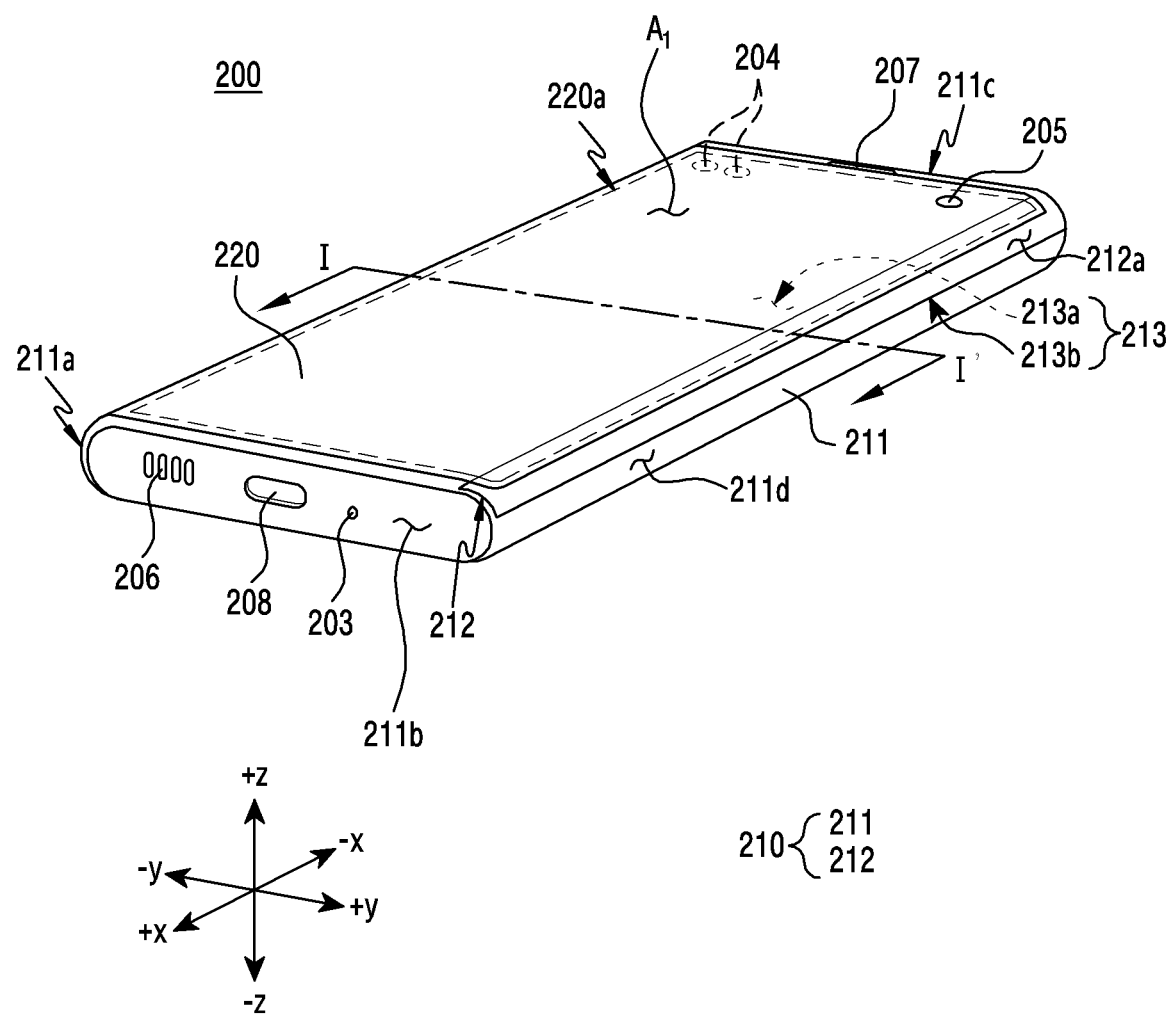
FIG. 2A is a perspective view illustrating an electronic device according to an embodiment in a closed state.
Figure 2B:
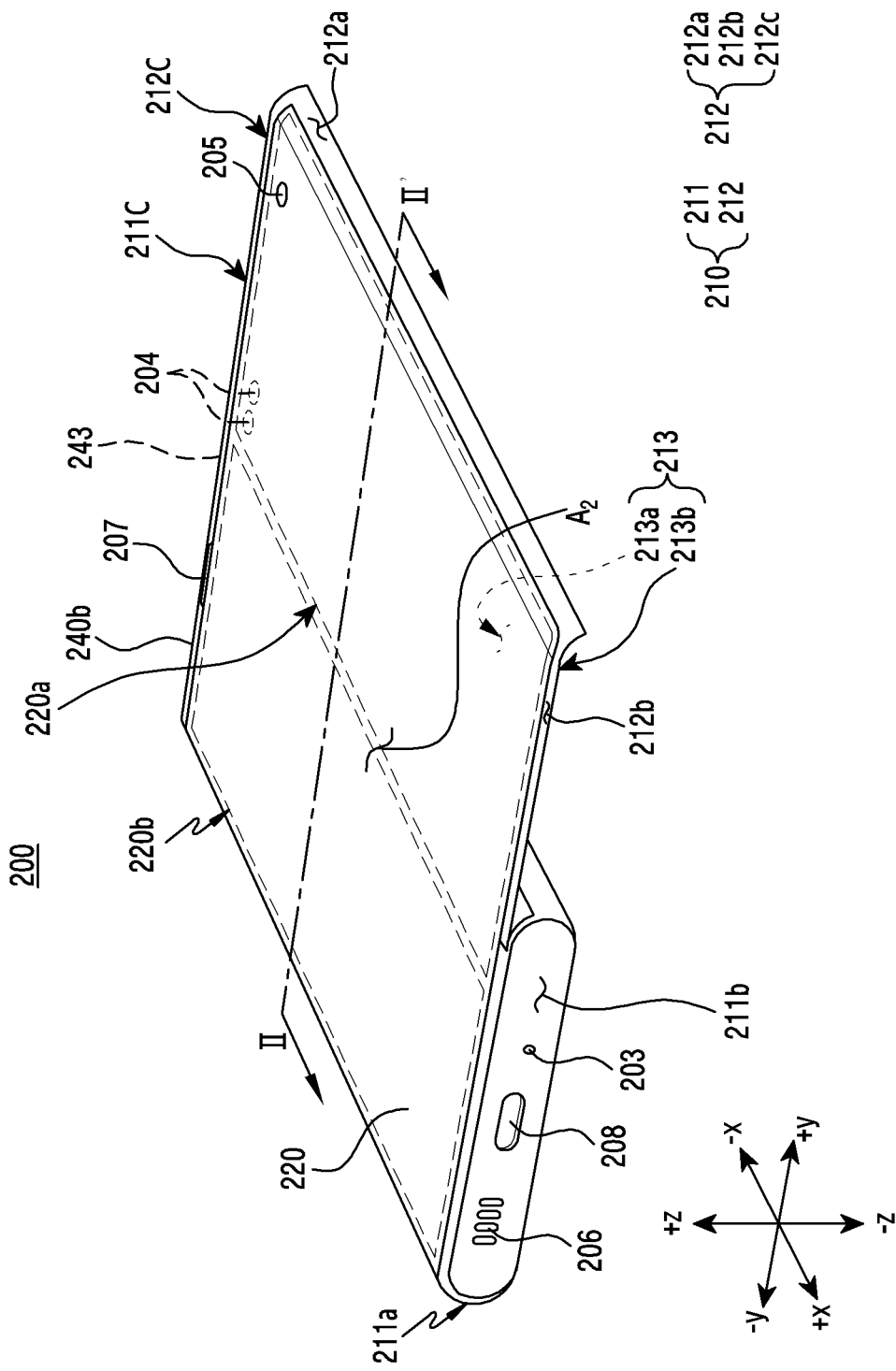
FIG. 2B is a perspective view illustrating the electronic device according to an embodiment in an opened state.

FIG. 2A is a perspective view illustrating an electronic device according to an embodiment in a closed state, and FIG. 2B is a perspective view illustrating the electronic device according to an embodiment in an opened state.

Referring to FIGS. 2A and 2B, an electronic device 200 (e.g., the electronic device 101 of FIG. 1) according to an embodiment may include a housing 210 and/or a flexible display 220 (hereinafter, referred to as a "display" for short).

According to an embodiment, the housing 210 may include a first structure 211 and/or a second structure 212 movably assembled (or coupled) to the first structure 211. In an example, the second structure 212 may slide within a predetermined range with reference to the first structure 211. For example, the second structure 212 may move away from the first structure 211 by sliding to a first direction (e.g., the +y direction of FIGS. 2A and 2B) with respect to the first structure 211. As another example, the second structure 212 may come closer to the first structure 211 by sliding to a second direction (e.g., the −y direction in FIGS. 2A and 2B) opposite to the first direction with respect to the first structure 211. In an example, when the second structure 212 moves away from the first structure 211 by the sliding of the second structure 212 toward the first direction, the housing 210 may be expanded. In another example, when the second structure 212 comes closer to the first structure 211 by the sliding of the second structure 212 toward the second direction, the housing 210 may be contracted.

In the disclosure, a state in which the second structure 212 is maximally distant from the first structure 211 (or "separated state") is defined as an "opened state" (or an "open state"), and a state in which the second structure 212 is maximally close to (or adjacent to) the first structure 211 is defined as a "closed state" (or a "close state". Hereinafter, the expressions "opened state" and "closed state" may also be used in the same meaning as defined.

In an embodiment, the first structure 211 may include a first side wall 211a, a second side wall 211b, a third side wall 211c, a fourth side wall 211d, and/or a rear surface plate (not illustrated) and may define at least one area of the side surface and/or at least one area of the rear surface of the electronic device 200.

In an example, the first side wall 211a may define a side surface facing the second direction of the electronic device 200 (e.g., the −y direction of FIGS. 2A and 2B). In another example, the second side wall 211b may define a portion of a side facing a third direction of the electronic device 200 (e.g., the +x direction of FIGS. 2A and 2B), and the third side wall 211c may define a portion of a side surface of the electronic device 200 facing a fourth direction (e.g., the −x direction in FIGS. 2A and 2B) opposite to the third direction. In another example, the fourth side wall 211d may define at least one area of a side surface of the electronic device 200 facing the first direction (e.g., the +y direction of FIGS. 2A and 2B) opposite to the second direction. For example, the first side wall 211a may be disposed to face the fourth side wall 211d, and the second side wall 211b may be disposed to face the third side wall 211c. As another example, the second side wall 211b may be connected to one end of the first side wall 211a (e.g., one end in the +x direction in FIGS. 2A and 2B) and/or one end of the fourth side wall 211d (e.g., one end in the +x direction FIG. 2A and FIG. 2B), and the third side wall 211c may be connected to the other end of the first side wall 211a (e.g., one end in the −x direction of FIGS. 2A and 2B) and/or the other end of the fourth side wall 211d (e.g., one end in the −x direction of FIGS. 2A and 2B).

In another example, the rear surface plate may define the rear surface of the electronic device 200 facing a sixth direction (e.g., the −z direction of FIGS. 2A and 2B). In an example, in the first structure 211, an inner space may be defined by the first side wall 211a, the second side wall 211b, the third side wall 211c, the fourth side wall 211d, and/or the rear surface plate of the first structure 211, and the second structure 212 may be accommodated in the above-mentioned inner space. For example, the first side wall 211a, the second side wall 211b, the third side wall 211c, the fourth side wall 211d, and/or the rear surface plate of the first structure 211 may be integrated, but the disclosure is not limited thereto.

In an embodiment, the second structure 212 may include a fifth side wall 212a, a sixth side wall 212b, a seventh side wall 212c, and/or a support plate 213.

In an example, the fifth side wall 212a of the second structure 212 may define a portion of a side surface of the electronic device 200 facing the first direction (e.g., the +y direction of FIGS. 2A and 2B). For example, the fifth side wall 212a may define a side surface of the electronic device 200 facing the first direction together with the fourth side wall of the first structure 211.

In another example, the sixth side wall 212b may define a portion of a side surface of the electronic device 200 facing the third direction (e.g., the +x direction of FIGS. 2A and 2B), and the seventh side wall 212c may define a portion of a side surface of the electronic device 200 facing the fourth direction (e.g., the −x direction in FIGS. 2A and 2B).

In another example, the support plate 213 may include a first surface 213a facing the fifth direction (e.g., the +z direction of FIGS. 2A and 2B) and/or a second surface 213b facing the sixth direction opposite to the fifth direction. For example, at least a partial area of the display 220 may be disposed on the first surface 213a of the support plate 213, and the second surface 213b of the support plate may define a portion of the rear surface of the electronic device 200.

In an example, since the second structure 212 is accommodated in the inner space defined by the first side wall 211a, the second side wall 211b, the third side wall 211c, the fourth side wall, and/or the rear surface plate of the first structure 211, a partial area of the sixth side wall 212b and/or the seventh side wall 212c of the second structure 212 may be covered by the first structure 211 and may be invisible from outside the electronic device 200. In an example, the fifth side wall 212a, the sixth side wall 212b, the seventh side wall 212c, and/or the support plate 213 of the second structure 212 may be integrated, but the disclosure is not limited thereto.

In an example, the second structure 212 may slide relative to the first structure 211 within a predetermined range. For example, the second structure 212 may slide to the first direction with respect to the first structure 211, and due to the sliding of the second structure 212, the distance between the first side wall 211a of the first structure 211 and the fifth side wall 212a of the second structure 212 may increase. As another example, the second structure 212 may slide to the second direction opposite to the first direction with respect to the first structure 211, and due to the sliding of the second structure 212, the distance between the first side wall 211a of the first structure 211 and the fifth side wall 212a of the second structure 212 may decrease.

In an example, when the electronic device 200 is in the closed state, the distance between the first side wall 211a of the first structure 211 and the fifth side wall 212a of the second structure 212 may be the shortest. In another example, when the electronic device 200 is in the opened state, the distance between the first side wall 211a and the fifth side wall 212a of the second structure 212 may be the longest.

The electronic device 200 according to an embodiment may have a structure in which the length of the first side wall 211a and the fourth side wall 211d of the first structure 211 is longer than the length of the second side wall 211b and the third side wall 211c. For example, the electronic device 200 may have a structure in which the length of the side surfaces parallel to the +x direction or the −x direction is longer than the length of the side surface parallel to the +y direction or the −y direction. However, the structure of the electronic device 200 is not limited to the above-described embodiments.

According to an embodiment, the display 220 may have a flexible property to be partially transformed in shape and structure and may define at least a portion of the front surface of the electronic device 200 (e.g., the surface facing the +z direction in FIGS. 2A and 2B). In an example, the display 220 may be disposed on at least one area of the outer peripheral surface of the second structure 212 and may slide together with the second structure 212 when the second structure 212 slides with respect to the first structure 211.

In an embodiment, the display 220 may include a flat area (flat region) 220a and/or a rolling area (rolling region) 220b. In an example, the flat area 220a of the display 220 may mean an area that is disposed on the first surface 213a of the support plate 213 of the second structure 212 to be always visible from outside the electronic device 200 regardless of the state of the electronic device 200 (e.g., the closed state or the opened state). In another example, the rolling area 220b of the display 220 may mean an area that is selectively visible from outside the electronic device 200 depending on the state of the electronic device 200. The flat area 220a of the display 220 may include a curved surface bent toward the fourth side wall 211d of the first structure 211 in at least one end portion (e.g., the end portion in the +y direction of FIGS. 2A and 2B) to extend seamless. In an example, when the electronic device 200 in the closed state, the rolling area 220b of the display 220 may be accommodated in the inner space of the first structure 211 to be invisible from outside the electronic device 200.

In another example, when the electronic device 200 is switched from the closed state to the opened state, the rolling area 220b of the display 220 may be moved out to the exterior of the electronic device 200 from the inner space of the first structure 211 by the sliding of the second structure 212. When the electronic device 200 is switched from the closed state to the opened state, as the rolling area 220b is moved out to the exterior of the electronic device 200, the entire area of the display 220 visible from outside the electronic device 200 may increase. For example, when the electronic device 200 is in the closed state, the area of the display 220 visible from outside the electronic device 200 may be a first area A1. In contrast, when the electronic device 200 is in the opened state, the area of the display 220 visible from outside the electronic device 200 may be a second area A2 that is larger than the first area A1.

In another example, when the electronic device 200 is switched from the opened state to the closed state, the rolling area 220b of the display 220 may be moved into the inner space of the first structure 211 due to the sliding of the second structure 212. When the electronic device 200 is switched from the opened state to the closed state, as the rolling area 220b is moved into the inner space of the first structure 211, the entire area of the display 220 visible from outside the electronic device 200 may decrease.

According to an embodiment, the electronic device 200 may provide a screen (e.g., a display area) having a size corresponding to the area of the display 220 visible from outside the electronic device 200. For example, when the electronic device 200 is in the closed state, the electronic device 200 may provide a screen having an area corresponding to the size of the flat area 220a of the display 220 (e.g., A1 in FIG. 2A). As another example, when the electronic device 200 is in the opened state, the electronic device 200 may provide a screen having an area corresponding to the sum of the sizes of the flat area 220a and a partial area of the rolling area 220b of the display 220.

According to an embodiment, the electronic device 200 may further include at least one of key input devices (not illustrated), sensor modules 204, audio modules (e.g., microphone hole 203, speaker holes 206 and 207), a camera module 205, and/or a connector hole 208. In another embodiment, in the electronic device 200, at least one of the above-mentioned components (e.g., the key input device) may be omitted, or other components may be additionally included.

In an embodiment, the key input device may be disposed on at least one side surface of the housing 210, and the electronic device 200 may detect a user input via the key input device. For example, the key input devices may be disposed in at least one area of the second side wall 211b of the first structure 211, but the disclosure is not limited thereto. In another embodiment, the electronic device 200 may not include some or all of the key input devices, and the key input devices, which are not included, may be implemented in other forms such as soft keys on the display 220.

In an embodiment, the electronic device 200 may include the sensor modules 204 to generate electrical signals or data values corresponding to an internal operating state or an external environmental state. For example, the sensor modules 204 may include at least one of a distance sensor configured to measure the distance between the first structure 211 and the second structure 212 (e.g., a TOF sensor), a proximity sensor, a fingerprint sensor, a biometric sensor (e.g., an HRM sensor), a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor. However, the types of sensor modules are not limited to the above-mentioned example.

In an embodiment, various audio modules of the electronic device 200 may include a microphone hole 203 and/or speaker holes 206 and 207. The microphone hole 203 may include a microphone disposed therein so as to acquire external sound, and in some embodiments, multiple microphones may be disposed therein so as to detect the direction of sound. The speaker holes 206 and 207 may include an external speaker hole 206 and/or a call receiver hole 207. In some embodiments, the speaker holes 206 and 207 and the microphone hole 203 may be implemented as a single hole, or a speaker may be included without the speaker holes (e.g., a piezo speaker).

In an embodiment, the camera module 205 may include at least one camera device and/or a flash (not illustrated) disposed on the front surface and/or rear surface of the electronic device 200. In an example, the at least one camera device may include one or more lenses, an image sensor, and/or an image signal processor. In another example, the flash may include, for example, a light-emitting diode or a xenon lamp. In some embodiments, two or more lenses (an infrared camera, a wide-angle lens, and a telephoto lens) and an image sensor may be disposed on one surface of the electronic device 200 (e.g., the rear surface of the electronic device 200).

In an embodiment, the connector hole 208 may accommodate a connector configured to transmit and receive power and/or data to and from an external electronic device, and/or a connector configured to transmit and receive an audio signal to and from an external electronic device. For example, the connector hole 208 may include a USB connector and/or an earphone jack disposed on at least one side surface of the electronic device 200. In an embodiment, the USB connector and the earphone jack may be implemented as a single hole, and according to another embodiment, the electronic device 200 may transmit and receive power and/or data or transmit and receive an audio signal to and from an external electronic device (e.g., the electronic device 102 or 104 in FIG. 1) without a separate connector hole.

Figure 3B:
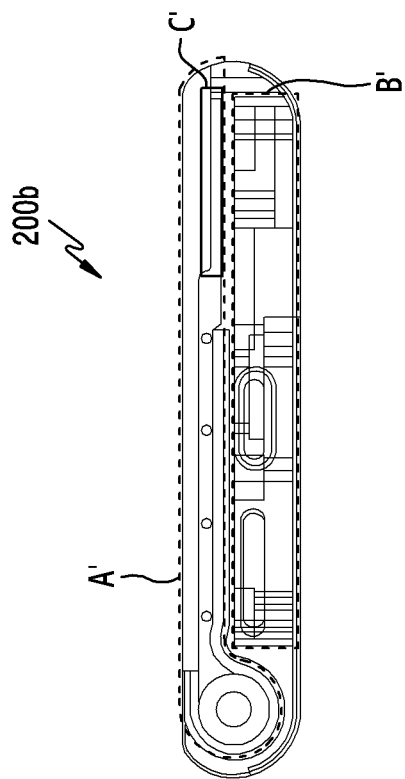
FIGS. 3A and 3B illustrate, respectively, cross-sectional views illustrating, in comparison, disposition structures inside a rollable electronic device according to a comparative embodiment and a rollable electronic device according to various embodiments of the disclosure.
Figure 3A:
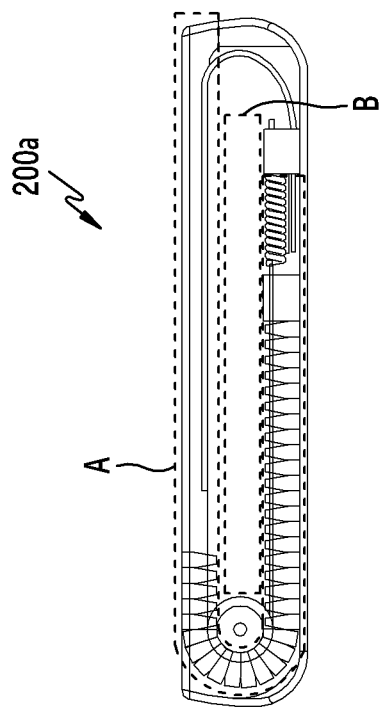

FIGS. 3A and 3B illustrate cross-sectional views (taken along, for example, line I-I' in FIG. 2A) illustrating, in comparison, disposition structures inside a rollable electronic device 200a according to a comparative embodiment and a rollable electronic device 200b according to various embodiments of the disclosure.

FIG. 3A illustrates a display area A and an electronic component disposition area B in a rollable electronic device 200a according to a comparative embodiment, and FIG. 3B illustrates a display area A' and an electronic component disposition area B' in a rollable electronic device 200b according to various embodiments of the disclosure.

Referring to FIG. 3A, in the case of the rollable electronic device 200a according to the comparative embodiment, a flexible display may be disposed over the top and bottom portions of the rollable electronic device 200a. In the rollable electronic device 200a according to the comparative embodiment, the area occupied by the display area A is disposed over the top and bottom portions of the rollable electronic device 200a rather than being disposed on one side of the rollable electronic device 200a, and the electronic component disposition area B may be disposed between the top and bottom portions in the display area A. Accordingly, spatial efficiency of disposing electronic components (e.g., a battery and a printed circuit board) in the electronic component disposition area B may be low, and assembly of the display area A and the electronic component disposition area B may be difficult.

Referring to FIG. 3B, in the case of a rollable electronic device 200b according to various embodiments of the disclosure, a flexible display may be disposed on the top portion of the rollable electronic device 200b. In the rollable electronic device 200b according to various embodiments of the disclosure, the area occupied by the display area A' may be placed on one side (i.e., the top portion) of the rollable electronic device 200b, and the electronic component disposition area B' may be placed on the other side (i.e., the bottom portion) of the rollable electronic device 200b independently of the display area A'. According to an embodiment, the display area A' may be modularized by reducing the thickness, so it is possible to increase spatial efficiency of disposing electronic components (e.g., the battery 502 and the printed circuit board 501 of FIG. 8B) in the electronic component disposition area B'. In addition, it is possible to facilitate assembly of the display area A' and the electronic component deposition area B'.

According to an embodiment, in the rollable electronic device 200b according to various embodiments of the disclosure, at least a partial area C' of the display area A' may be a portion to be coupled to the electronic component disposition area B' and/or a housing of the rollable electronic device 200b, and the display may be disposed in the remaining area of the display area A'.

Referring to FIGS. 4 to 7, a process of assembling the display module (e.g., the display area A' of FIG. 3B) of the rollable electronic device 200b will be described.

Figure 4:
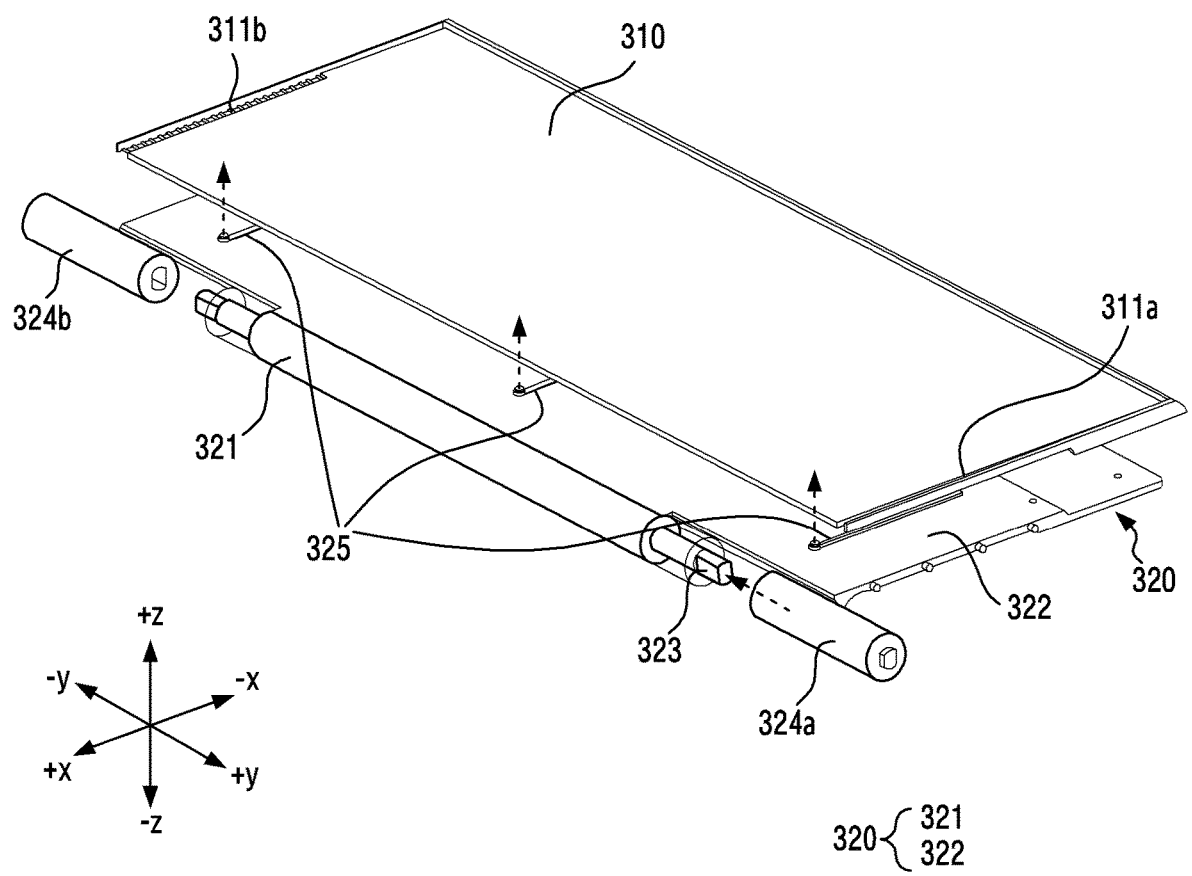
FIG. 4 is a perspective view illustrating how a slide guide and a bracket are assembled in a display module of a rollable electronic device according to an embodiment.

FIG. 4 is a perspective view illustrating a state in which a slide guide 310 (e.g., the second structure 212 of FIGS. 2A and 2B) and a bracket 320 are assembled in the display module 300 of the rollable electronic device 200b according to an embodiment.

Referring to FIG. 4, the slide guide 310 may include a top surface facing a first direction (e.g., the +z direction in FIG. 4) and a rear surface facing a second direction (e.g., the −z direction in FIG. 4) opposite to the first direction, and the bracket 320 may include a top surface facing the first direction and a rear surface facing the second direction opposite to the first direction. According to an embodiment, connecting terminals 311a and 311b configured to fix (or connect) a flexible display (e.g., the flexible display 330 of FIG. 5) to the top surface of the slide guide 310 may be disposed on the top surface of the slide guide 310. According to another embodiment, the flexible display may be fixed to the top surface of the slide guide 301 by an adhesive material, and the connecting terminals 311a and 311b may be omitted. The bottom surface of the slide guide 310 may be disposed to be movable on the bracket 320 while being in contact with the top surface of the bracket 320.

According to an embodiment, the bracket 320 may include a rotary drive portion 321 configured to serve as a reference for movement of the slide guide 310 and a slide portion 322 seamlessly connected to the rotary drive portion 321. The rotary drive portion 321 and the slide portion 322 may be integrated. According to an embodiment, the rotary drive shaft 323 may be included inside the rotary drive portion 321, and rotary drive shaft caps 324a and 324b may be coupled to opposite ends of the rotary drive shaft 323. According to an embodiment, the rotary drive shaft caps 324a and 324b may rotate together when the slide guide 310 moves and may transmit a driving force to the slide guide 310. According to another embodiment, the rotary drive shaft 323 and the rotary drive shaft caps 324a and 324b may be integrated.

According to an embodiment, the bottom surface of the slide guide 310 may be coupled to be in contact with the top surface of the slide portion 322 of the bracket 320. According to an embodiment, the slide portion 322 may include thereon one or more guide grooves 325 configured to guide the movement of the slide guide 310 and to prevent the slide guide 310 from being twisted. According to an embodiment, the one or more guide grooves 325 may have a straight line shape directed to a direction to which the slide guide 310 slides (e.g., the −x direction in FIG. 4). When the slide guide 310 is moved out or moved in, the slide guide 310 may move along the guide grooves with reference to the rotary drive shaft 323, and only the slide guide 310 may move separate from the bracket 320, that is, in the state in which the bracket 320 is fixed.

Figure 5:
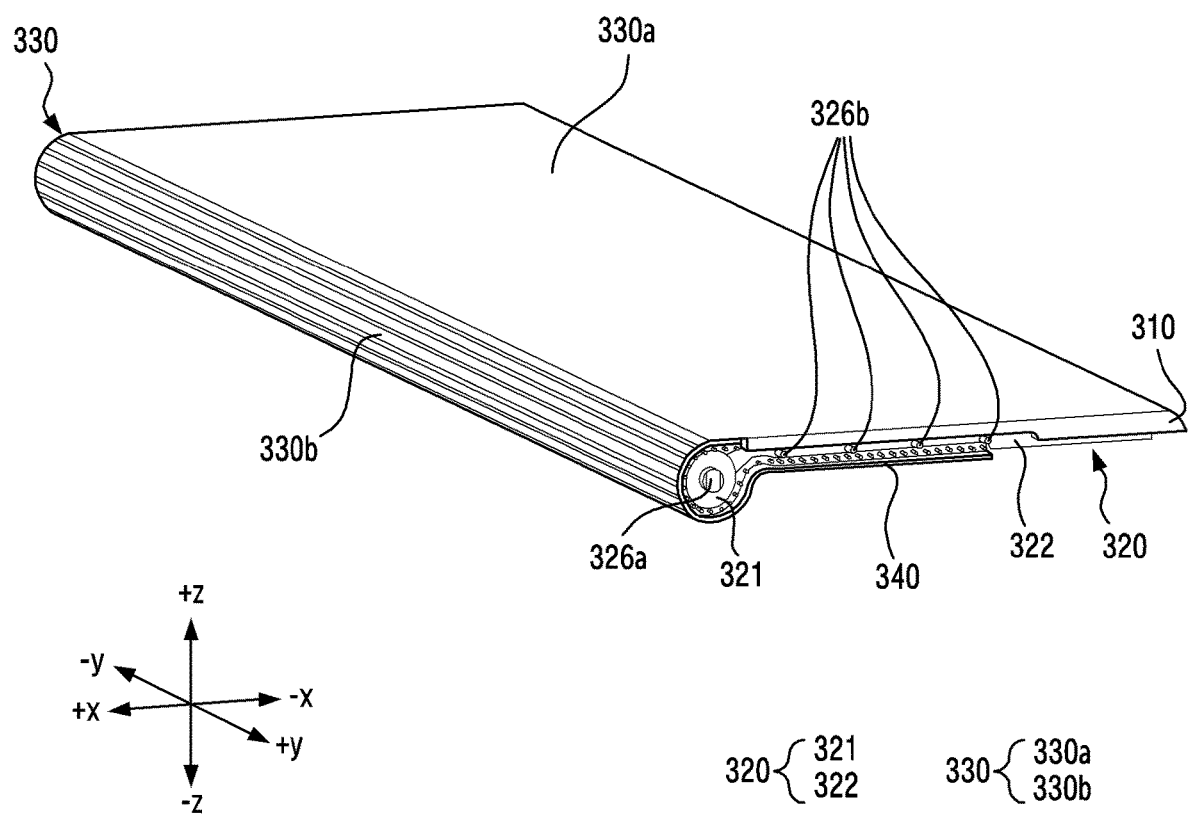
FIG. 5 is a perspective view illustrating a state in which a flexible display and multiple bars are assembled in the display module of FIG. 4.

FIG. 5 is a perspective view illustrating a state in which the flexible display 330 (e.g., the display 220 of FIGS. 2A and 2B) and multiple bars 340 are assembled in the display module 300 of FIG. 4.

Referring to FIG. 5, the flexible display 330 and the multiple bars 340 may be disposed to surround the slide guide 310 and the bracket 320 of FIG. 4. According to an embodiment, the connecting terminals 311a and 311b disposed on the top surface of the slide guide 310 of FIG. 4 may be coupled to the multiple bars 340 to fix the flexible display 330 to the slide guide 310. According to an embodiment, the flexible display 330 and/or the multiple bars 340 may be bonded to the top surface of the slide guide 310. Accordingly, when the slide guide 310 is moved in the direction of the guide grooves 325 (e.g., the −x direction in FIG. 4), the flexible display 330 may be moved out from the rollable electronic device 200b.

According to an embodiment, the flexible display 330 may be disposed to cover the top surface of the slide guide 310, the rotary drive portion 321 of the bracket 320, and a portion of the rear surface of the slide portion 322 of the bracket 320. According to an embodiment, multiple bars 340 configured to support the flexible display 330 may be further disposed on one surface of the flexible display 330, and the flexible display 330 and the multiple bars 340 may be disposed to cover the top surface of the slide guide 310, the rotary drive portion 321 of the bracket 320, and a portion of the rear surface of the slide portion 322 of the bracket 320. According to an embodiment, the multiple bars 340 may be disposed between the flexible display 330 and the top surface of the slide guide 310, between the flexible display 330 and the outer surface of the rotary drive portion 321, and between the flexible display 330 and the rear surface of the slide portion 322.

According to an embodiment, the flexible display 330 may include a flat area (flat region) 330a (e.g., the flat area 220a of FIGS. 2A and 2B) and a rolling area (rolling region) 330b (e.g., the rolling area 220b of FIGS. 2A and 2B). According to an embodiment, the flat area 330a may mean an area disposed on the top surface of the slide guide 310, and the flat area 330a may be always exposed to outside the rollable electronic device 200b regardless of the state (e.g., the closed state or the opened state) of the rollable electronic device 200b. According to an embodiment, the rolling area 330b may mean an area disposed in a portion of the rear surface of the rotary drive portion 321 of the bracket 320 and the slide portion 322 of the bracket 320, and the rolling area 330b may be selectively exposed to outside the rollable electronic device 200b depending on the state of the rollable electronic device 200b. That is, the flat area 330a may cover the top surface of the slide guide 310, and the rolling area 330b may cover the outer surface of the rotary drive portion 321 and a portion of the rear surface of the slide portion 322.

According to an embodiment, at least a portion of the rolling area 330b may not be visible from outside when the rollable electronic device 200b is in the closed state. According to an embodiment, when the rollable electronic device 200b is in the closed state, at least a portion of the area surrounding the rotary drive portion 321 in the rolling area 330b may be exposed to outside, and another portion of the area surrounding the rotary drive portion 321 in the rolling area 330b and the area surrounding the slide portion 322 in the rolling area 330b may not be exposed to outside due to the housing (e.g., the main housing 400 of FIGS. 8A and 8B) of the rollable electronic device 200b.

According to an embodiment, when the rollable electronic device 200b is switched from the closed state to the opened state, the rolling area 330b may be moved out to the exterior of the rollable electronic device 200b by the sliding of the slide guide 310. When the rollable electronic device 200b is switched from the closed state to the opened state, as the rolling area 330b is moved out to the exterior of the rollable electronic device 200b, the entire area of the flexible display 330 that is visible from outside may increase. For example, when the rollable electronic device 200b is in the opened state, the display may be exposed to outside up to the rolling area 330*b* surrounding the rear surface of the slide portion 322 in the closed state.

According to an embodiment, the bracket 320 may include main protrusions 326*a* and one or more auxiliary protrusions 326*b* configured to fix gears to be described later (e.g., the main gears 350 and the auxiliary gears 360 of FIG. 6). According to an embodiment, the main protrusions 326*a* may be disposed on opposite side surfaces of the rotary drive portion 321 of the bracket 320 (e.g., the surface in the +y direction in FIG. 5 and the −y direction surface in FIG. 5), and the one or more auxiliary protrusions 326*b* may be disposed on opposite side surfaces (e.g., the surface in the +y direction of FIG. 5 and the surface in the −y direction surface of FIG. 5) of the slide portion 322 of the bracket 320. According to an embodiment, the display module 300 may transmit a driving force to the flexible display 330 and the multiple bars 340 via the gears coupled to the main protrusions 326*a* and the one or more auxiliary protrusions 326*b*.

Figure 6:
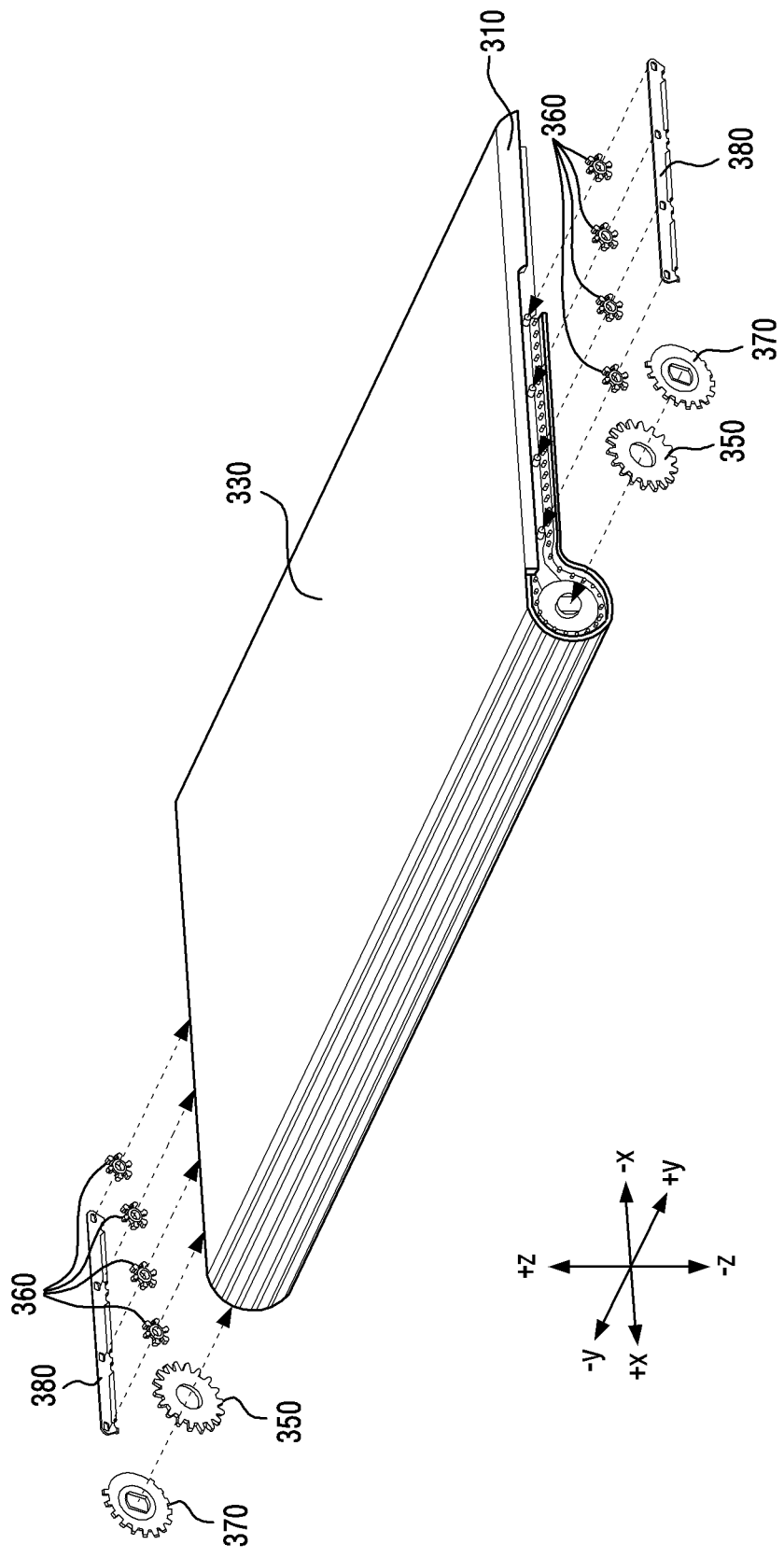
FIG. 6 is a perspective view illustrating how gears and gear covers are assembled in the display module of FIG. 5.

FIG. 6 is a perspective view illustrating how the gears 350 and 360 and the gear covers 370 and 380 are assembled in the display module 300 of FIG. 5.

Referring to FIG. 6, a main gear 350, one or more auxiliary gears 360, a main gear cover 370, and/or auxiliary gear cover 380 may be coupled to each of opposite side surfaces (e.g., the surface in the +y direction of FIG. 5 and the surface in the −y direction of FIG. 5) of the bracket 320. According to an embodiment, one main gear 350 may be disposed on each of the opposite side surfaces (e.g., the surface in the +y direction in FIG. 5 and the surface in the −y direction in FIG. 5) of the rotary drive portion 321, and multiple auxiliary gears 360 may be disposed on each of the opposite side surfaces (e.g., the surface in the +y direction in FIG. 5 and the surface in the −y direction in FIG. 5) of the slide portion 322. According to an embodiment, the main gears 350 may be coupled by being fitted to the main protrusions 326*a* of FIG. 5, and the auxiliary gear 360 may be coupled by being fitted to the auxiliary protrusions 326*b* of FIG. 5. According to an embodiment, when the slide guide 310 is to be moved out or moved in, the main gears 350 and the one or more auxiliary gears 360 may transmit a driving force to the flexible display 330 and the multiple bars 340.

According to an embodiment, the main gear covers 370 configured to fix the main gears 350 to the bracket 320 may be disposed on the opposite side surfaces of the rotary drive portion 321 (e.g., the surface in the +y direction of FIG. 5 and the surface in the −y direction of FIG. 5), and auxiliary gear covers 380 configured to fix the auxiliary gears 360 to the bracket 320 may be disposed on the opposite side surfaces (e.g., the surface in the +y direction of FIG. 5 and the surface in the −y direction of FIG. 5) of the slide portion 322. The main gear covers 370 may be coupled by being fitted to the main protrusions 326*a* of FIG. 5 while covering the main gears 350, and the auxiliary gear covers 380 may be coupled by being fitted to the auxiliary protrusions 326*b* of FIG. 5 while covering the multiple auxiliary gears 360. According to an embodiment, the multiple auxiliary gears 360 may be fixed to the slide portion 322 of the bracket 320 by an integrated single auxiliary gear cover 380. According to another embodiment, the multiple auxiliary gears 360 may be fixed to the slide portion 322 of the bracket 320 by multiple auxiliary gear covers 380, respectively.

The shape of the main gear covers 370 and/or the shape of the auxiliary gear covers 380 are not limited to those illustrated in FIG. 6. For example, a main gear cover 370 and an auxiliary gear cover 380 may be integrally configured as a single component.

A detailed method for transmitting a driving force to the flexible display 330 and the multiple bars 340 by the main gears 350 and the auxiliary gears 360 will be described later with reference to FIG. 12.

FIGS. 7A, 7B, and 7C are views illustrating a display module 300 of a rollable electronic device 200*b* according to an embodiment. More specifically, FIG. 7A is a plan view illustrating the display module 300 viewed from above, FIG. 7B is a rear view illustrating the display module 300 viewed from below, and FIG. 7C is a perspective view of the display module 300.

Figure 8A:
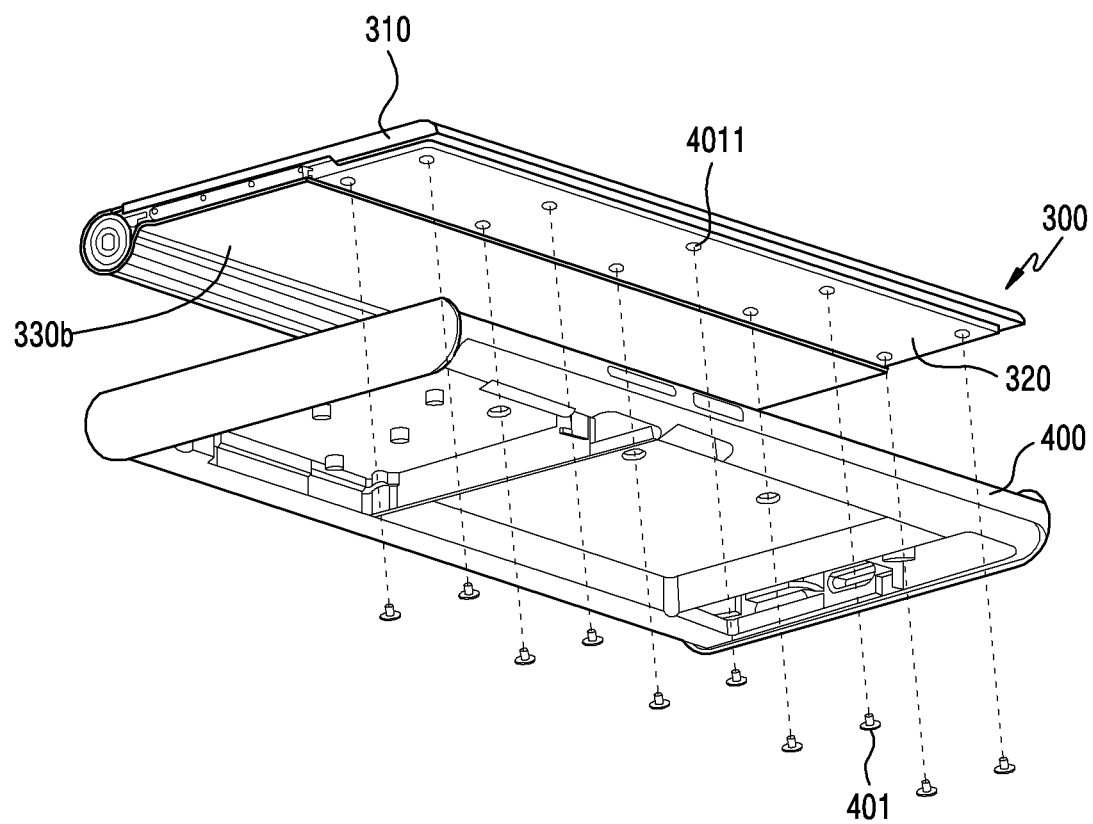
FIG. 8A is a perspective view illustrating how a display module and a main housing according to an embodiment are assembled.
Figure 8B:
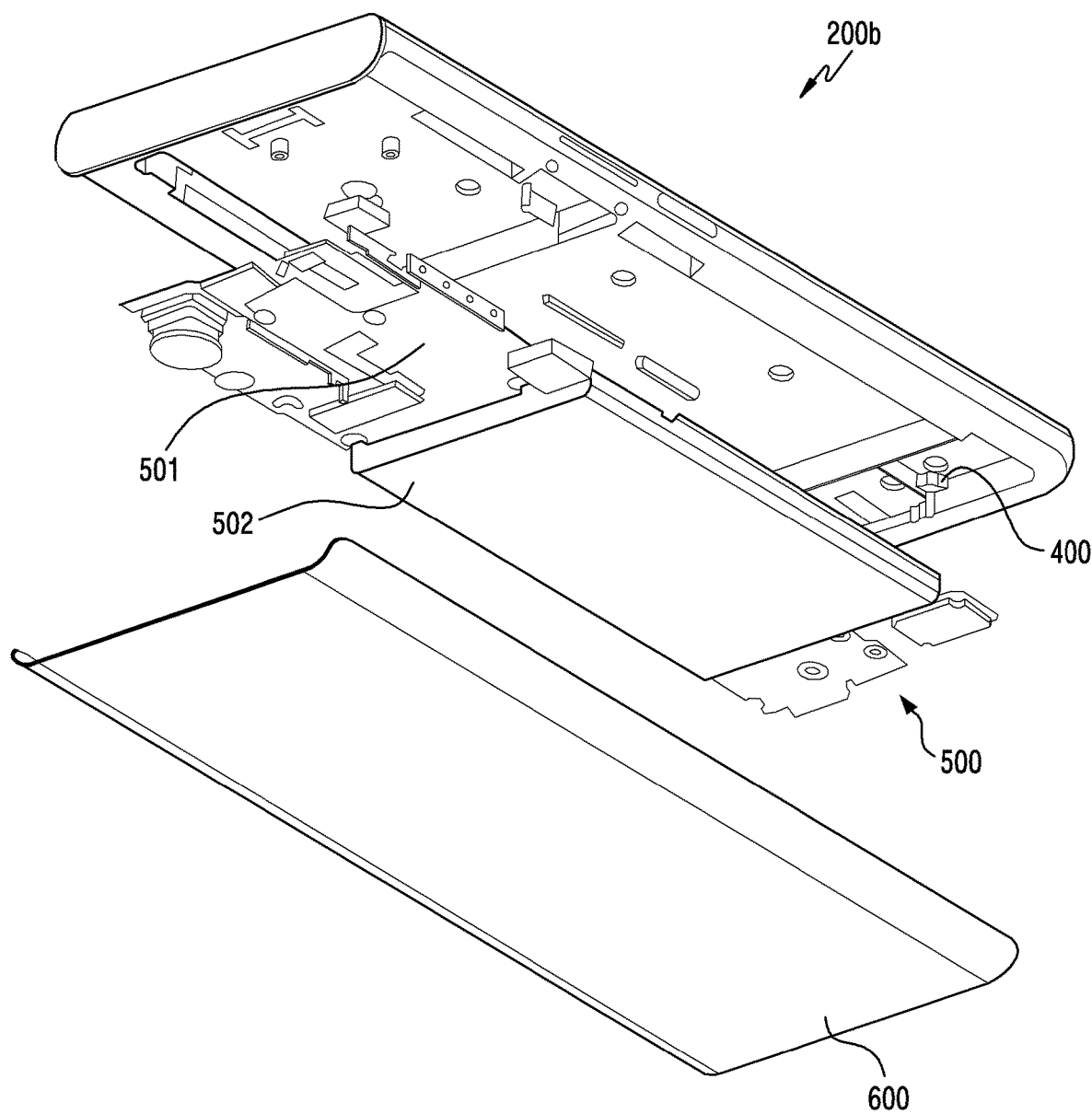
FIG. 8B is a perspective view illustrating how electronic components and a rear surface cover are assembled in the display module and the main housing of FIG. 8A.

According to an embodiment, the display module 300 assembled through the processes of FIGS. 4 to 6 may be assembled separately from a housing (e.g., the main housing 400 and the rear surface cover 600 of FIGS. 8A and 8B) of the rollable electronic device 200*b* and/or electronic components (e.g., the electronic components 500 of FIGS. 8A and 8B) disposed inside the rollable electronic device 200*b*. According to an embodiment, the display module 300 may be independent without being affected by the housing of the rollable electronic device 200*b* and/or the electronic components disposed inside the rollable electronic device 200*b* during the assembly process. According to an embodiment, the bracket 320 may serve as a basic housing to which driving elements of the display module 300 (e.g., the slide guide 310, the flexible display 330, the multiple bars 340, the main gears 350, the auxiliary gears, the main gear covers 370, and the auxiliary gear covers 380) are to be assembled. In addition, the bracket 320 may be the center of assembly in constructing the display module 300 in the rollable electronic device 200*b*.

According to an embodiment, the rear surface of the display module 300 may be coupled to the main housing 400 of the rollable electronic device 200*b*. For example, an area that is exposed to outside the display module 300 in the rear surface of the slide portion 322 of the bracket 320 (that is, the area that is not covered by the flexible display 330 in the rear surface of the slide portion 322 of the bracket 320) may be coupled to the main housing 400 of the rollable electronic device 200*b*.

Referring to FIGS. 8A and 8B, a process of assembling the display module 300 and other components of the rollable electronic device 200*b* will be described.

FIG. 8A is a perspective view illustrating how the display module 300 and the main housing 400 (e.g., the first structure 211 of FIGS. 2A and 2B) according to an embodiment are assembled.

Referring to FIG. 8A, the display module 300 according to an embodiment may be coupled to the main housing 400 which defines at least a portion of the exterior of the rollable electronic device 200*b*. According to an embodiment, in the area that is exposed to outside the display module 300 in the rear surface of the slide portion 322 of the bracket 320 (i.e., the area that is not covered by the flexible display 330 in the rear surface of the slide portion 322 of the bracket 320), multiple grooves 4011 into which multiple screws 401 can be assembled may be provided. According to an embodiment, the rear surface of the slide portion 322 may be fixed to the main housing 400 by the multiple screws 401, and the display module 300 may be assembled with the main housing 400. According to an embodiment, in the state in which the display module 300 and the main housing 400 are coupled, at least a portion of the rolling area 330b of the flexible display 330 may not be exposed to outside by the main housing 400.

Referring to FIG. 8B, the main housing 400 according to an embodiment may be coupled with electronic components 500 configured to execute various functions of the rollable electronic device 200b and a rear surface cover 600 (e.g., the rear surface plate of FIGS. 2A and 2B) defining the rear surface of the rollable electronic device 200b. According to an embodiment, a space configured to accommodate the electronic components 500 may be provided in the main housing 400, and the electronic components 500 may be disposed in the space. The electronic components 500 may include, for example, a printed circuit board 501, a battery 502, a sensor module, an audio module, and/or a camera module. According to an embodiment, in a state in which the electronic components 500 are accommodated in the main housing 400, the rear surface cover 600 may be coupled to the rear surface of the main housing 400 to prevent the electronic components 500 from being exposed to outside and to protect the electronic components 500. According to an embodiment, the main housing 400 may be made of a metal material, and the rear surface cover 600 may be made of a glass material. However, the materials of the main housing 400 and the rear surface cover 600 are only examples and are not limited thereto.

According to an embodiment, the space in which the electronic components 500 including the printed circuit board 501 and the battery 502 are disposed in the rollable electronic device 200b may be provided as an independent space not to be affected by the sliding operation of the display module 300.

Figure 9:
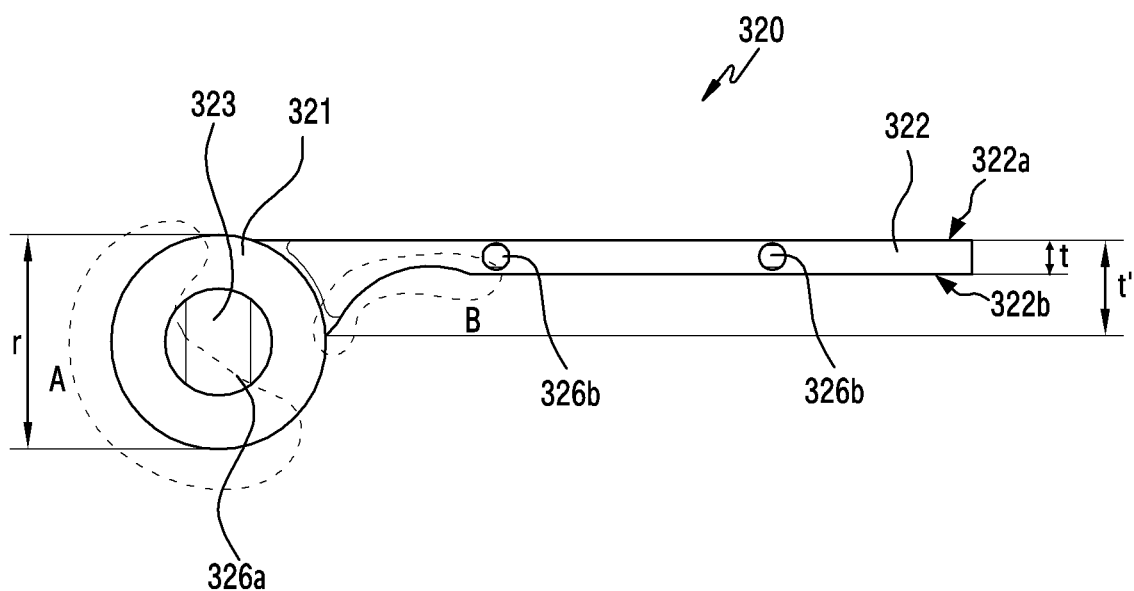
FIG. 9 is a view illustrating a bracket of a display module according to an embodiment.

FIG. 9 is a view illustrating a bracket 320 of a display module 300 according to an embodiment.

Referring to FIG. 9, the bracket 320 according to an embodiment may include a rotary drive portion 321 including a rotary drive shaft 323, and a slide portion 322. The rotary drive shaft 323 may serve as a reference for sliding movement when the slide guide 310 is moved into or moved out from the rollable electronic device 200b. According to an embodiment, the rotary drive portion 321 may have a cylindrical shape, and the slide portion 322 may have a plate shape in which a top surface 322a is flat. The diameter r of the cylindrical rotary drive portion 321 may be greater than the thickness t of the slide portion 322, and the thickness t' of the edge of the slide portion 322 adjacent to the rotary drive portion 321 may be greater than the thickness t of the other edges. That is, the slide portion 322 may have a shape in which the thickness t' of the area adjacent to the rotary drive portion 321 is the thickest and the thickness gradually decreases in a direction away from the rotary drive portion 321.

According to an embodiment, the bracket 320 has the greatest thickness r at the center of the rotary drive portion 321 and gradually becomes thinner toward the slide portion 322 to have a constant thickness t with reference to a certain area. For example, the bracket 320 may have a shape in which one cylinder and one plate are seamlessly connected as a whole.

According to an embodiment, the top surface 322a of the slide portion 322 may be flat. According to an embodiment, the area of the rear surface 322b of the slide portion 322 adjacent to the rotary drive portion 321 may have a curved surface, and the area of the rear surface 322b of the slide portion 322 spaced apart from the rotary drive portion 321 may have a flat surface. According to an embodiment, the direction of the curvature of a curved area A of the rotary drive portion 321 and the direction of the curvature of a curved first edge area B of the slide portion 322 adjacent to the rotary drive portion 321 (e.g., curved directions) may be opposite to each other. For example, the bent area A of the rotary drive portion 321 may have a convex shape, and the first edge area B of the slide portion 322 may have a concave shape. As another example, the curved area A of the rotary drive portion 321 may form an inward curvature with respect to the bracket 320, and the first edge area B of the slide portion 322 may form an outward curvature with respect to the bracket 320.

According to an embodiment, the internal stress generated due to a length difference in the thickness direction in the portion A of the flexible display 330 that surrounds the rotary drive portion 321 when the slide guide 310 (and the flexible display 330) is moved out from the rollable electronic device 200b may be mitigated (or compensated for) by the portion B of the flexible display 330 that surrounds the first edge of the slide portion 322.

According to an embodiment, the flexible display 330 (and the multiple bars 340) may be disposed according to the shape of the bracket 320 while surrounding the outer surface of the bracket 320, and when the flexible display 330 slides, an appropriate driving force may be received by the bracket 320 having the shape illustrated in FIG. 9. According to an embodiment, the bracket 320 may shape the flexible display 330 (and the multiple bars 340), and the flexible display 330 may be moved into or moved out from the rollable electronic device 200b by receiving a driving force corresponding to the shape of the bracket 320.

Figure 10:
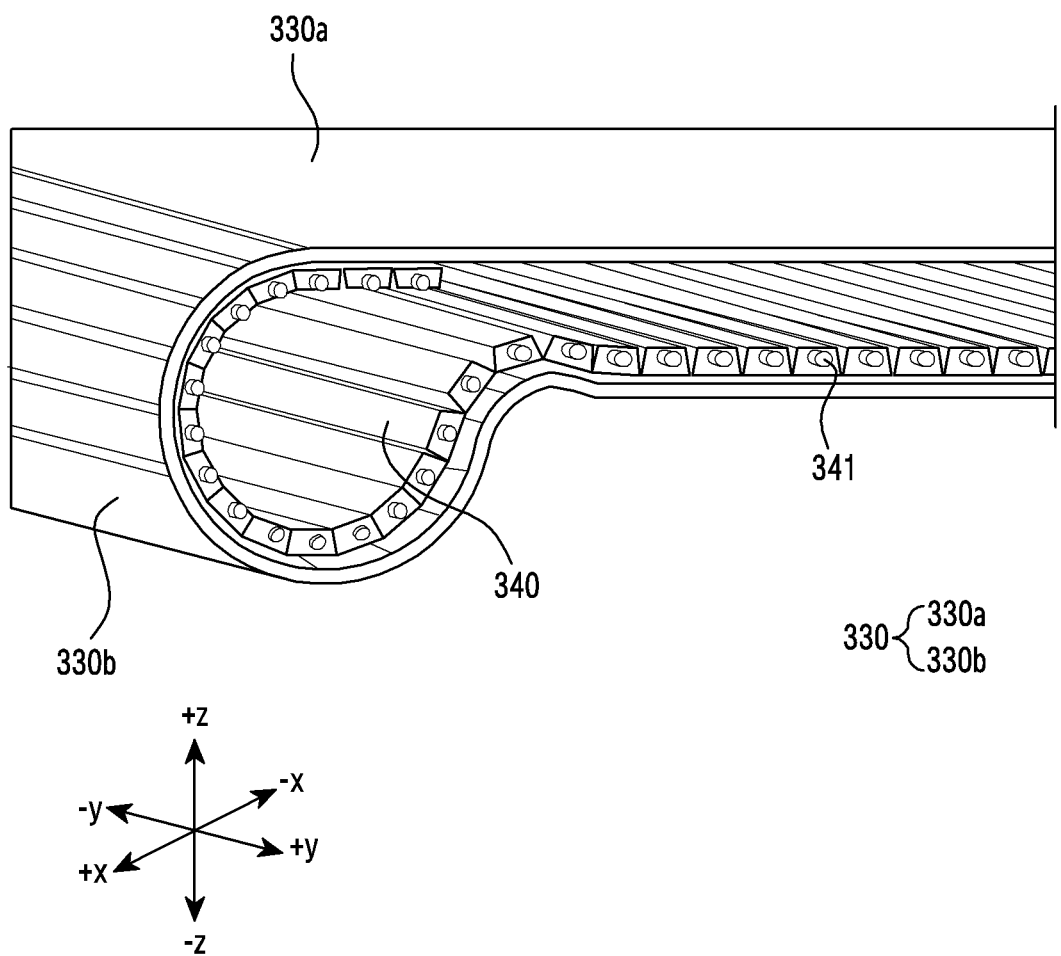
FIG. 10 is a view illustrating a flexible display and multiple bars of a display module according to an embodiment.

FIG. 10 is a view illustrating the flexible display 330 and the multiple bars 340 of the display module 300 according to an embodiment.

Referring to FIG. 10, the multiple bars 340 may be disposed on the inner surface of the flexible display 330, may support the flexible display 330, and may guide the movement of the flexible display 330. According to an embodiment, the multiple bars 340 may be bonded to the inner surface of the flexible display 330. According to an embodiment, the flexible display 330 and/or the multiple bars 340 may be disposed in a shape surrounding the outer surface of the bracket 320 and may have the same or similar shape as the bracket 320. According to an embodiment, the shape of the flexible display 330 (and the multiple bars 340) may correspond to the shape of the bracket 320, and the flexible display 330 (and the multiple bars 340) may have a shape in which one cylinder (i.e., the area corresponding to the rotary drive portion 321) and one plate (i.e., the area corresponding to the slide portion 322) are seamlessly connected to each other, as a whole.

The multiple bars 340 according to an embodiment may serve to support the flexible display 330 in a straight section (i.e., the section surrounding the slide portion 322 of the bracket 320) and may serve to guide the flexible display 330 to move along a circular curve in a curved section (i.e., in the section surrounding the rotary drive portion 321 of the bracket 320).

According to an embodiment, bumps 341 may be disposed at opposite ends of each of the multiple bars 340. According to an embodiment, a bump 341 may protrude from one end of each of the multiple bars 340 by a predetermined length in a direction parallel to the bar (e.g., the +y direction in FIG. 10). Although not illustrated, a bump 341 may also protrude from the other end of each of the multiple bars 340 by a predetermined length in a direction parallel to the bar (e.g., the −y direction in FIG. 10). According to an embodiment, the multiple bars 340 may control the position and driving of the flexible display 330 in association with the bumps 341. According to an embodiment, the protruding length of the bumps 341 may be greater than the thickness of the gears 350 and 360. The relationship between the protruding length of the bumps 341 and the thickness of the gears 350 and 360 will be described later with reference to FIG. 14.

FIG. 11 is a perspective view illustrating how the gears 350 and 360 and the gear covers 370 and 380 are assembled in the display module 300 according to an embodiment.

Referring to FIG. 11, a main gear 350 may be coupled to one side surface of the rotary drive portion 321 of the bracket 320, and one or more auxiliary gears 360 may be coupled to one side surface of the slide portion 322 of the bracket 320. For example, four auxiliary gears 360 may be coupled to the slide portion 322. However, the disclosure is not limited thereto, and the number of auxiliary gears 360 to be coupled to the slide portion 322 may vary depending on the width of the slide portion 322. According to an embodiment, on one side surface of the rotary drive portion 321, a main protrusion 326a protruding by a predetermined length in a direction parallel to the rotary drive shaft 323 (e.g., the +y direction in FIG. 11) may be provided, and one side surface of the slide portion 322, one or more auxiliary protrusions 326b protruding by a predetermined length in a direction parallel to the rotary drive shaft 323 (e.g., the +y direction in FIG. 11) may be provided.

According to an embodiment, the main gear 350 may be coupled to the main protrusion 326a, and the auxiliary gears 360 may be coupled to the auxiliary protrusions 326b. According to an embodiment, in the center of the main gear 350 and/or each of the auxiliary gears 360, an opening 352 or 362 may be provided. The shape of the opening 352 in the main gear 350 may correspond to the shape of the cross section of the main protrusion 326a, and the shape of the openings 362 in the auxiliary gears 360 may correspond to the shape of the cross section of the auxiliary protrusions 326b. According to an embodiment, the main gear 350 may be coupled to the rotary drive portion 321 of the bracket 320 by fitting the opening 352 of the main gear 350 to the main protrusion 326a. According to an embodiment, the auxiliary gears 360 may be coupled to the slide portion 322 of the bracket 320 by fitting the openings 362 of the auxiliary gears 360 to the auxiliary protrusions 326b, respectively. According to an embodiment, the main gear 350 and/or the auxiliary gears 360 may be rotatably coupled to the main protrusion 326a and/or the auxiliary protrusions 326b.

According to an embodiment, when the main gear 350 and the auxiliary gears 360 are coupled to the bracket 320, the teeth 351 of the main gear 350 and the teeth 361 of the auxiliary gears 360 may be arranged to be engaged with the bumps 341.

According to an embodiment, a main gear cover 370 configured to fix the main gear 350 to the bracket 320 may be further coupled to the main protrusion 326a, and an auxiliary gear cover 380 configured to fix the auxiliary gears 360 to the bracket 320 may be further coupled to the auxiliary protrusions 326b. According to an embodiment, multiple auxiliary gears 360 may be fixed to the slide portion 322 of the bracket 320 by a single auxiliary gear cover 380. According to an embodiment, the main gear cover 370 may have an opening 372 in the center thereof, and the auxiliary gear cover 380 may have openings 382 at positions corresponding to the auxiliary gears 360. The shape of the opening 372 in the main gear cover 370 may correspond to the shape of the cross section of the main protrusion 326a, and the shape of the openings 382 in the auxiliary gear cover 380 may correspond to the shape of the cross section of the auxiliary protrusions 326b. According to an embodiment, the main gear cover 370 may be coupled to the rotary drive portion 321 of the bracket 320 by fitting the opening 372 of the main gear cover 370 to the main protrusion 326a. According to an embodiment, the auxiliary gear cover 380 may be coupled to the slide portion 322 of the bracket 320 by fitting the openings 362 of the multiple auxiliary gear covers 380 to the multiple auxiliary protrusions 326b, respectively.

According to an embodiment, the main gear cover 370 may have a shape corresponding to the main gear 350, and the auxiliary gear cover 380 may have a shape corresponding to a surface obtained by connecting the multiple auxiliary gears 360. For example, the main gear cover 370 may be a plate-like member having a shape similar to a circle, and the auxiliary gear cover 380 may be a plate-like member having a shape similar to a rectangle.

According to an embodiment, the main gear cover 370 and/or the auxiliary gear cover 380 may include, at the outer periphery thereof, one or more bent portions 371 and 381 configured to restrain the bumps 341 of the multiple bars 340. According to an embodiment, the one or more bent portions 371 and 381 may have a shape bent in a direction surrounding the bumps 341. According to an embodiment, the bent portions 371 of the main gear cover 370 and/or the bent portions 381 of the auxiliary gear cover 380 may be disposed to restrain the bumps 341 and may control the position of the flexible display 330 (and the multiple bars 340).

FIG. 11 illustrates only one side surface of the rollable electronic device 200b, but the opposite side of the rollable electronic device 200b may also be disposed in the same manner as in FIG. 11. This may be equally applied to all drawings of the disclosure.

FIG. 12 is a diagram illustrating a driving principle of the display module 300 according to an embodiment.

Referring to FIG. 12, the main gear 350 may be disposed in the rotary drive portion 321 of the bracket 320 such that the teeth 351 of the main gear 350 are engaged with the bumps 341 of the multiple bars 340, and the auxiliary gears 360 may be disposed in the slide portion 322 of the bracket 320 such that the teeth 361 of the auxiliary gears 360 are engaged with the bumps 341 of the multiple bars 340. According to an embodiment, the main gear 350 may transmit a rotational driving force to the flexible display 330 (and the multiple bars 340), and the auxiliary gears 360 may transmit a linear driving force to the flexible display 330 (and the multiple bars 340). According to an embodiment, the multiple auxiliary gears 360 may be engaged with the bump 341 at a predetermined interval from each other, and when the rollable electronic device 200b is in the closed state (e.g., the state of the electronic device in FIG. 2A), the multiple auxiliary gears 360 may serve to keep the flexible display 330 taut.

Referring to FIG. 12, when the slide guide 310 moves to the opposite direction (i.e., the −x direction in FIG. 12) with respect to the rotary drive portion 321, the flexible display 330 coupled to the slide guide 310 is also movable together. In this case, the main gear 350 and the auxiliary gear 360 may rotate clockwise. According to an embodiment, when the main gear 350 rotates clockwise, the teeth 351 of the main gear 350 may rotate by being engaged with the bumps 341 of the multiple bars 340 and may transmit a driving force according to the circular shape to the flexible display 330 bonded to the bars 340. According to an embodiment, when the auxiliary gears 360 rotate clockwise, the teeth 361 of the auxiliary gears 360 may rotate in the state of being engaged with the bumps 341 of the multiple bars 340. That is, when the auxiliary gears 360 rotate clockwise, the teeth 361 of the auxiliary gears 360 may push the top portion of flexible display 330 in the sliding direction (i.e., the −x direction in FIG. 12) and may push the bottom portion of the flexible display 330 in the direction opposite to the sliding direction (i.e., the +x direction in FIG. 12). When the main gear 350 and the auxiliary gears 360 rotate clockwise, the area of the flexible display 330 that surrounds the slide guide 310 may receive a linear driving force in the sliding direction, the area of the flexible display 330 that surrounds the rotary drive portion 321 may receive a clockwise rotational driving force, and the area of the flexible display 330 that surrounds the rear surface of the slide portion 322 may receive a linear driving force in a direction opposite to the sliding direction. Accordingly, the state of the rollable electronic device 200b may change from the closed state (e.g., the state of the electronic device in FIG. 2A) to the opened state (e.g., the state of the electronic device in FIG. 2B).

Figure 13:
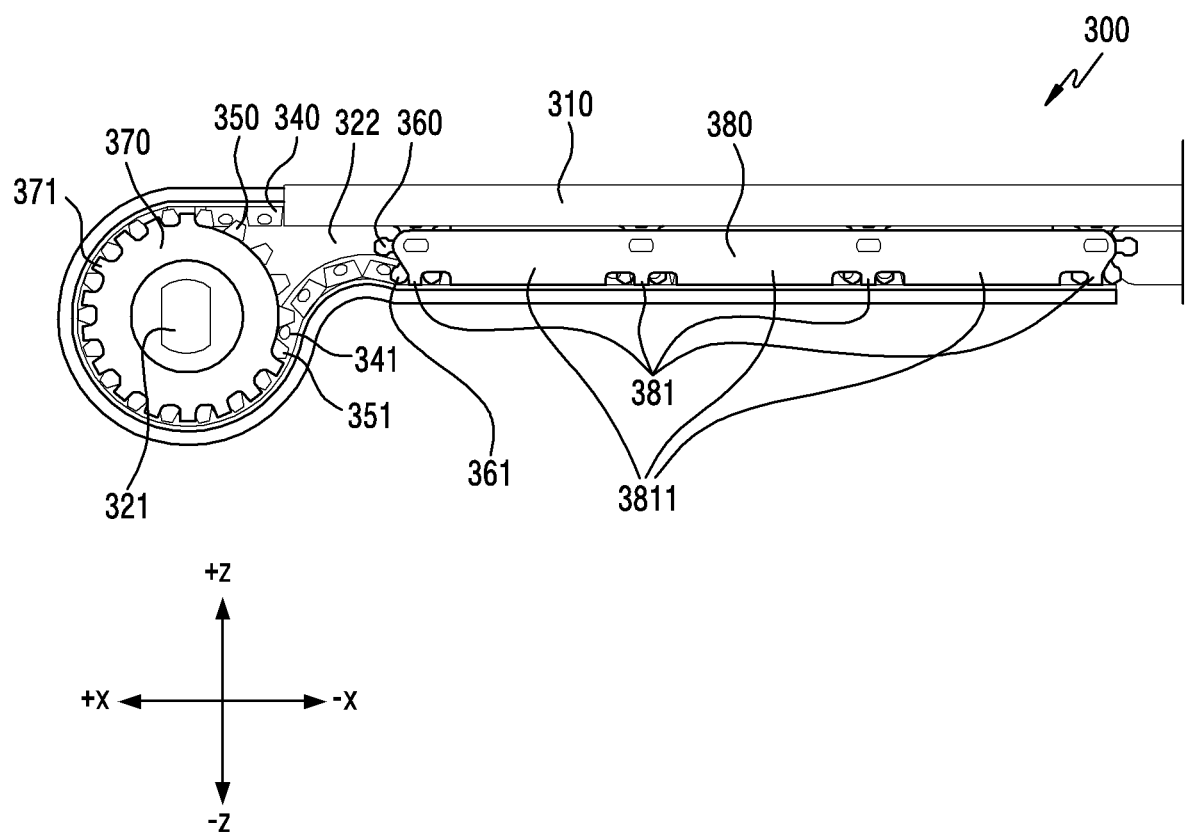
FIG. 13 is a view illustrating assembled gear covers in the display module of FIG. 12.
Figure 14:
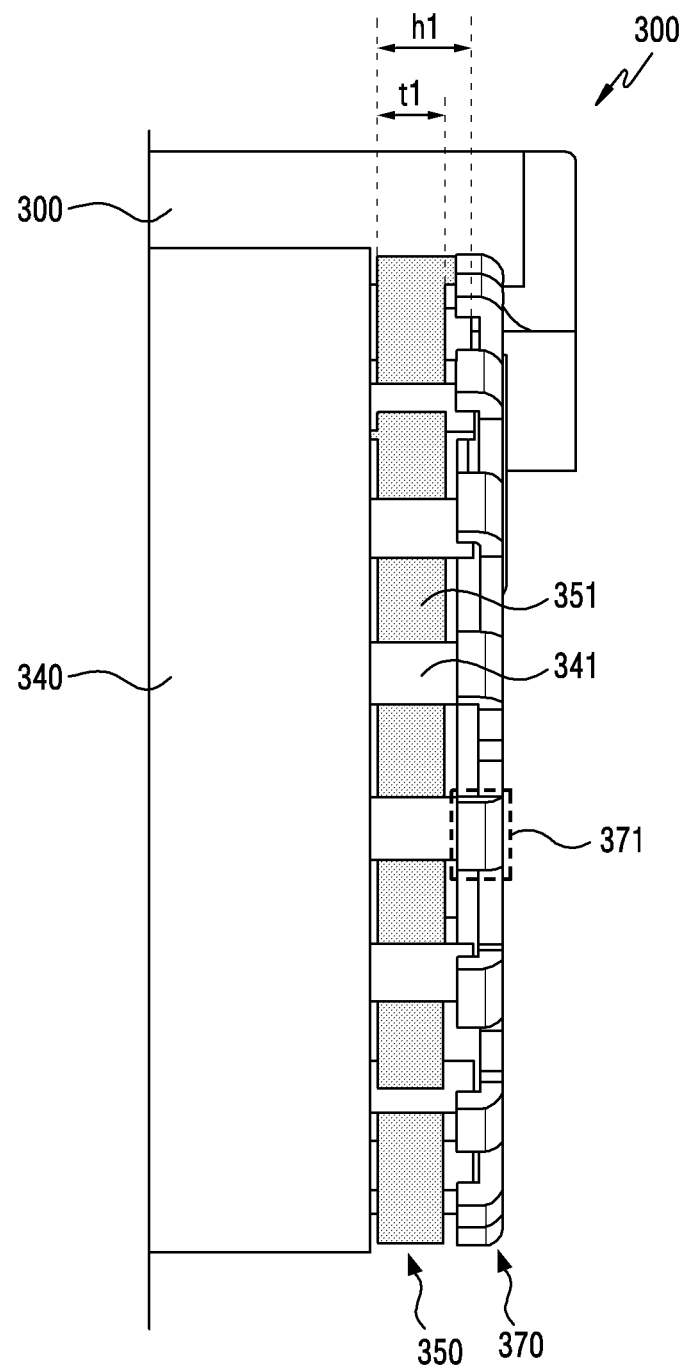
FIG. 14 is a view illustrating the display module of FIG. 13 viewed from a side.

FIG. 13 is a view illustrating a state in which the gear covers 370 and 380 are assembled in the display module 300 of FIG. 12, and FIG. 14 is a view illustrating the display module 300 of FIG. 13 viewed from a side.

Referring to FIG. 13, the main gear cover 370 may fix the main gear 350 to the bracket 320 to fix the shape and/or position of the circular driving of the flexible display 330 (and the multiple bars 340). The auxiliary gear cover 380 may fix the auxiliary gears 360 to the bracket 320 to fix the shape and/or position of the linear driving of the flexible display 330 (and the multiple bars 340). According to an embodiment, the main gear cover 370 and the auxiliary gear cover 380 restrain the bumps 341 located at the ends of the multiple bars 340 to control the flexible display 330 to move according to the driving shape.

According to an embodiment, the main gear cover 370 and the auxiliary gear cover 380 may include one or more bent portions 371 and 381 in the outer peripheral areas thereof. At least some of the outer areas of the main gear cover 370 and the auxiliary gear cover 380 may have a bent shape, which may be referred to as bent portions 371 and 381. According to an embodiment, when the main gear cover 370 and the auxiliary gear cover 380 are coupled to the bracket 320, the bent portions 371 and 381 may be disposed to correspond to the positions of the bumps 341 of the multiple bars 340. Referring to FIG. 14, when the main gear cover 370 is coupled to the bracket 320, the bent portions 371 may have a shape bent in a direction surrounding the bumps 341 of the multiple bars 340 and may restrain the bumps 341 to control the flexible display 330 to move according to the driving shape (e.g., the circular shape). Although not illustrated in FIG. 14, when the auxiliary gear cover 380 is coupled to the bracket 320, similarly to the bent portions 371, the bent portions 381 of the auxiliary gear cover 380 may also have a shape bent in a direction surrounding the bumps 341 of the multiple bars 340 and may restrain the bumps 341 to control the flexible display 330 to move according to the driving shape (e.g., the linear shape).

Referring to FIG. 13, the auxiliary gear cover 380 according to an embodiment may further include additional bent portions 3811 configured to restrain other bumps 341 in addition to the bent portions 381 configured to the bump 341 engaged with the teeth 361 of the auxiliary gear 360. According to an embodiment, when the auxiliary gear cover 380 is coupled to the bracket 320, similarly to the bent portions 381, the additional bent portions 3811 of the auxiliary gear cover 380 may have a shape bent in a direction surrounding the bumps 341 of the multiple bars 340 and may restrain the bumps 341 to control the flexible display 330 to move according to the driving shape (e.g., the linear shape).

Referring to FIG. 14, the protruding height h1 of the bumps 341 of the multiple bars 340 may be greater than the thickness t1 of the main gear 350. Accordingly, when the teeth 351 of the main gear 350 and the bumps 341 are engaged with each other and rotate, the main gear 350 may control the flexible display 330 to move without departing from the driving shape (e.g., the circular shape). Although not illustrated in FIG. 14, similarly, in the auxiliary gears 360, the protruding height h1 of the bumps 341 of the multiple bars 340 may be greater than the thickness of the auxiliary gears 360. Accordingly, when the teeth 361 of the auxiliary gears 360 and the bumps 341 are engaged with each other and rotate, the auxiliary gears 360 may control the flexible display 330 to move without departing from the driving shape (e.g., the linear shape).

Figure 15:
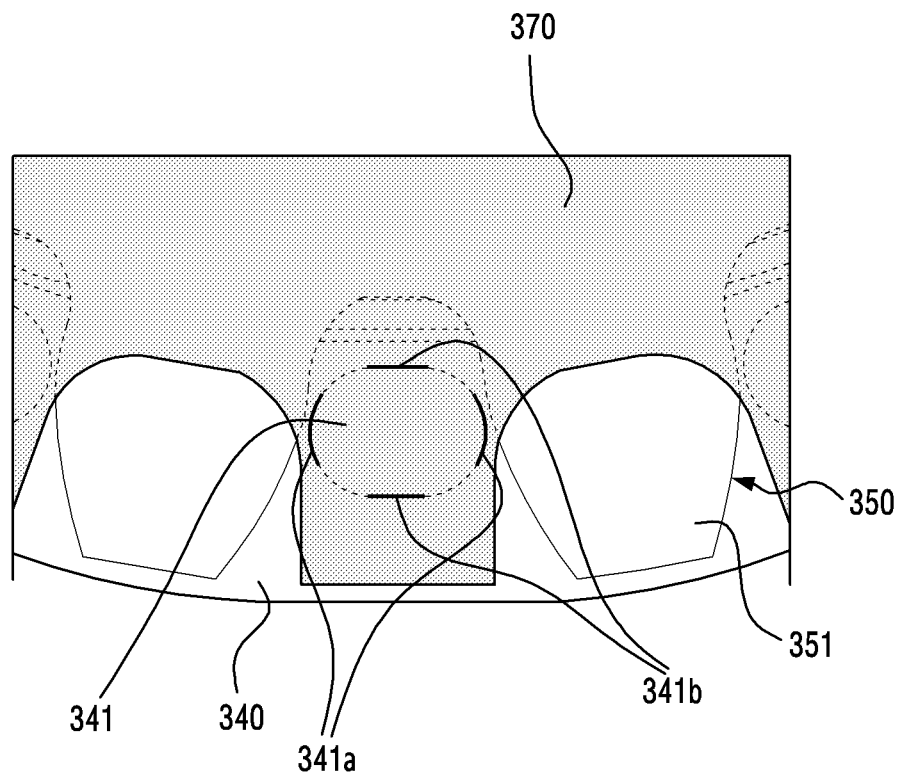
FIG. 15 is a view illustrating an engagement structure between bumps disposed on multiple bars and gears according to an embodiment.

FIG. 15 is a view illustrating an engagement structure between bumps 341 disposed on multiple bars 340 and gears 350 and 360 according to an embodiment.

Referring to FIG. 15, a bump 341 disposed at the end of each of the multiple bars 340 may have an oval shape or capsule shape, and the teeth 351 of the main gear 350 and the teeth 361 of the auxiliary gears 360 may be disposed to be engaged with the bumps 341. According to an embodiment, the left and right ends 341a of the bump 341 are areas to come into contact with the teeth 351 of the main gear 350 and/or the teeth 361 of the auxiliary gear 360 and may have a curved shape to transmit power in the state of being engaged with the teeth 351 of the main gear 350 and/or the teeth 361 of the auxiliary gears 360. According to an embodiment, the upper and lower ends 341b of the bump 341 may not come into contact with the teeth 351 of the main gear 350 and/or the teeth 361 of the auxiliary gears 360 and may have a straight line shape. According to another embodiment, the upper and lower ends 341b of the bump 341 may have a curved shape. In this case, the radius of curvature of the upper and lower ends 341b of the bump 341 may be greater than the radius of the left and right ends 341a of the bump 341. According to an embodiment, when an elliptical or capsule-shaped bump 341 is used, it is possible to reduce the diameters of the main gear cover 370 and the auxiliary gear cover 380 and to reduce the diameter of the rotary drive portion 321 of the bracket 320 and the thickness of the rollable electronic device 200b compared to the case in which a circular bump 341 is used.

Figure 16:
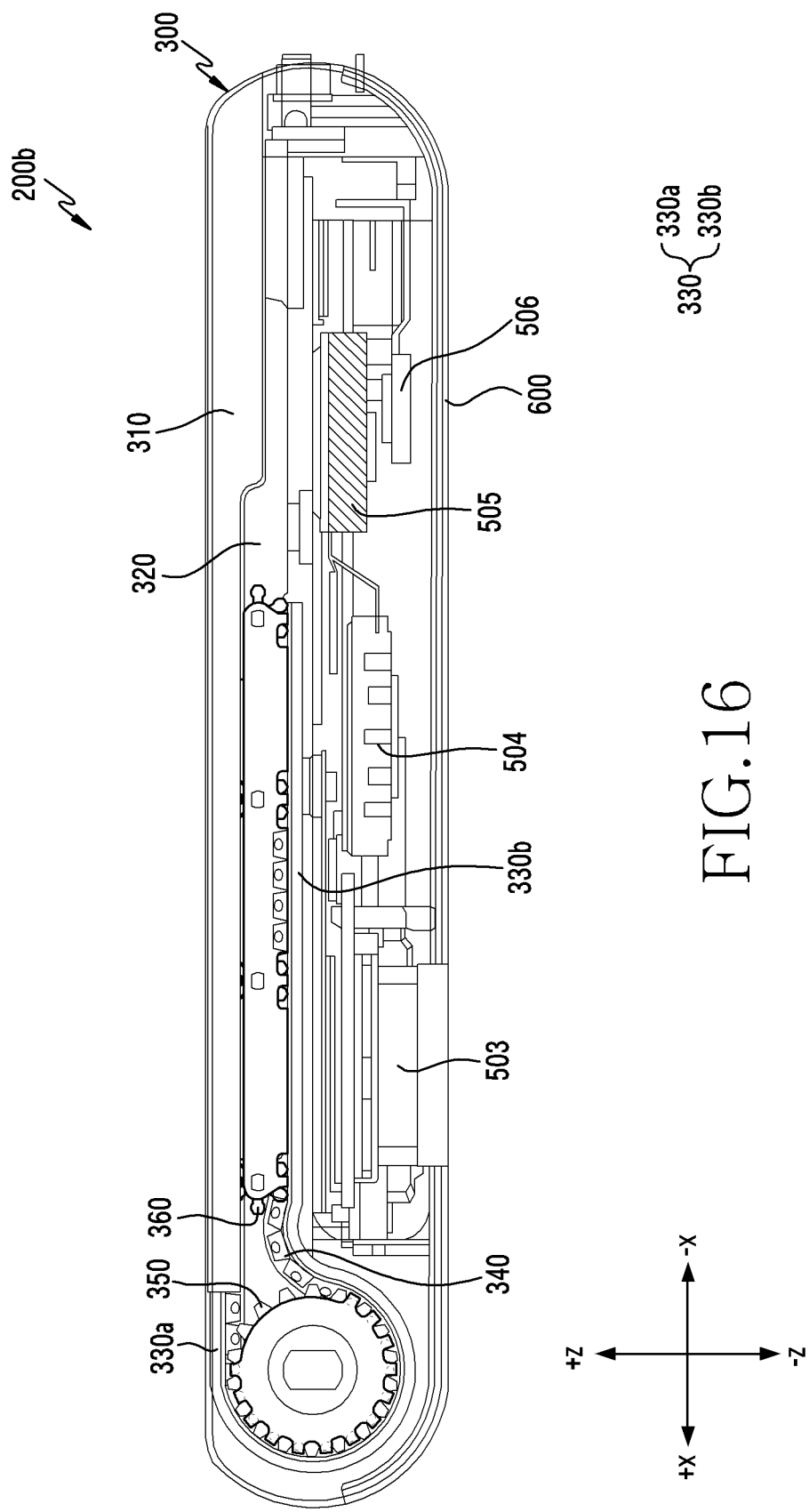
FIG. 16 is a cross-sectional view illustrating a display module disposition structure inside a rollable electronic device according to an embodiment.

FIG. 16 is a cross-sectional view illustrating a display module 300 disposition structure inside a rollable electronic device 200b according to an embodiment.

Referring to FIG. 16, the display module 300 may be coupled with a main housing 400 and a rear surface cover 600, and electronic components 500 may be disposed in the inner space of the main housing 400. The electronic components 500 may include, for example, a camera module 503, an antenna coil 504 for wireless charging, a processor 505, and/or a wireless communication circuit 506. According to an embodiment, the display module 300 may have a structure in which a slide guide 310, a flexible display 330, multiple bars 340, gears 350 and 360, and gear covers 370 and 380 are coupled to a bracket 320, which is the basic framework of the display module 300. According to an embodiment, the shape of the display module 300 may correspond to the shape of the bracket 320, and the display module 300 may have a shape in which one cylinder (i.e., the area corresponding to the rotary drive portion 321) and one plate (i.e., the area corresponding to the slide portion 322) are seamlessly connected to each other, as a whole.

According to an embodiment, the electronic components 500 including a printed circuit board 501 and a battery 502 may be disposed between an area that surrounds the rear surface of the bracket 320 in the rolling area 330*b* of the flexible display 330 and the rear surface cover 600. That is, all of the electronic components 500 of the rollable electronic device 200*b* may be disposed between the slide portion 322 of the bracket 320 and the rear surface cover 600 and may be disposed between an area of the display module 300 that corresponds to the slide portion 322 and the rear surface cover 600. According to an embodiment, the electronic components 500 disposed between the flat area 330*a* and the rolling area 330*b* of the flexible display 330 may not exist.

In the rollable electronic device 200*b* according to various embodiments of the disclosure, the electronic components 500 may be independently disposed without being affected by the driving of the display module 300. That is, the display module 300 may be modularized and assembled separately from the main housing 400 and/or the electronic components 500 and may facilitate assembly of the rollable electronic device 200*b*.

As described above, an electronic device (e.g., the electronic device 100 of FIG. 1, the electronic device 200 of FIGS. 2A and 2B, or the rollable electronic device 200*b* of FIG. 3B) according to an embodiment may include a housing defining at least a portion of the exterior of the electronic device, a rear surface cover defining the rear surface of the electronic device, a display module seated in the housing, wherein the display module includes a bracket including a rotary drive portion at a first edge, a slide guide disposed on the bracket to be movable with respect to the rotary drive portion, and a flexible display disposed to surround the top surface of the slide guide, the rotary drive portion, and a portion of the rear surface of the bracket, and a battery disposed between the rear surface cover and an area of the flexible display that surrounds the rear surface of the bracket within the housing.

According to an embodiment, at least one electronic component of the electronic device that includes the battery may be disposed between the rear surface cover and the area of the flexible display that surrounds the rear surface of the bracket.

According to an embodiment, the bracket may include a top surface facing a first direction and a rear surface facing a second direction opposite to the first direction, and the flexible display may be disposed to surround the top surface of the slide guide that faces the first direction, an outer surface of the rotary drive portion, and a portion of the rear surface of the bracket that faces the second direction.

According to an embodiment, the bracket may further include a slide portion located adjacent to the rotary drive portion.

According to an embodiment, the rotary drive portion may have a cylindrical shape and the slide part may have a flat plate shape. The cylindrical shape of the rotary drive portion may have a diameter greater than the thickness of the slide portion.

According to an embodiment, the first edge of the slide portion adjacent to the rotary drive portion may have a thickness greater than the thicknesses of the other edges.

According to an embodiment, the slide portion may include at least one guide groove configured to guide movement of the slide guide.

According to an embodiment, the display module may further include a main gear capable of being coupled to a side surface of the rotary drive portion, at least one auxiliary gear capable of being coupled to a side surface of the slide portion, a main gear cover configured to fix the main gear to the bracket, and an auxiliary gear cover configured to fix the at least one auxiliary gear to the bracket.

According to an embodiment, the display module may further include multiple bars configured to support the flexible display and to guide the movement of the flexible display.

According to an embodiment, a bump may be disposed on an end of each of the multiple bars.

According to an embodiment, the teeth of the main gear and the teeth of the at least one auxiliary gear may be disposed to be engaged with the bump.

According to an embodiment, the bump may have an oval shape or capsule shape, and areas of the bump adjacent to the teeth of the main gear and the teeth of the at least one auxiliary gear may have a curved shape.

According to an embodiment, the protruding height of the bump from the end of each of the multiple bars may be greater than the thickness of the main gear and the thickness of the at least one auxiliary gear.

According to an embodiment, each of the main gear cover and the auxiliary gear cover may include at least one bent portion at the outer periphery thereof, and the at least one bent portion may have a shape bent to restrain the bump.

As described above, an electronic device (e.g., the electronic device 100 of FIG. 1, the electronic device 200 of FIGS. 2A and 2B, or the rollable electronic device 200*b* of FIG. 3B) according to an embodiment may include a housing defining at least a portion of the exterior of the electronic device, a rear surface cover defining the rear surface of the electronic device, a display module seated in the housing, wherein the display module includes a bracket including a rotary drive portion at a first edge, a slide guide disposed on the bracket to be movable with respect to the rotary drive portion, a flexible display disposed to surround the top surface of the slide guide, the rotary drive portion, and a portion of the rear surface of the bracket, and multiple bars attached to the inner surface of the flexible display to support the flexible display and configured to guide movement of the flexible display, a printed circuit board disposed between the rear surface cover and an area of the flexible display that surrounds the rear surface of the bracket within the housing, and at least one gear disposed on a side surface of the bracket. The teeth of the at least one gear may be engaged with a bump disposed on each of the multiple bars to drive the display module.

According to an embodiment, the multiple bars may be disposed between the outer surface of the rotary drive portion and the flexible display and between the rear surface of the bracket and the flexible display.

According to an embodiment, the multiple bars may be further disposed between the top surface of the slide guide and the flexible display.

According to an embodiment, the at least one gear may include a main gear configured to transmit a rotational driving force to the multiple bars and the flexible display, and at least one auxiliary gear configured to transmit a linear driving force to the multiple bars and the flexible display.

According to an embodiment, the display module may further include a main gear cover configured to fix the main gear to the bracket, and an auxiliary gear cover configured to fix the at least one auxiliary gear to the bracket.

According to an embodiment, the bump may have an oval shape or capsule shape, and the protruding height of the bump from each of the multiple bars is greater than the thickness of the at least one gear.

In the above-described specific embodiments of the disclosure, components included in the disclosure have been expressed in singular or plural terms according to the presented specific embodiments. However, the singular or plural expressions are selected appropriately for the situation presented for convenience of description, and the disclosure is not limited to a singular constituent element or plural constituent elements. A constituent element expressed in a plural form may be configured with a singular element, or a constituent element expressed in a singular form may be configured with plural elements.

Meanwhile, in the detailed description of the disclosure, specific embodiments have been described, but various modifications are possible without departing from the scope of the disclosure. Therefore, the scope of the disclosure should not be limited to the described embodiments, but should be determined based not only on the claims described below, but also on equivalents to the claims.

The invention claimed is:

1. An electronic device comprising:
    a housing defining at least a portion of an exterior of the electronic device;
    a rear surface cover defining a rear surface of the electronic device;
    a display module seated in the housing, the display module comprising:
        a bracket comprising a rotary drive portion and a rear surface,
        a slide guide disposed on the bracket to be movable with respect to the rotary drive portion,
        a flexible display disposed to surround a top surface of the slide guide, the rotary drive portion, and a portion of the rear surface of the bracket,
            a main gear disposed at a side of the rotary drive portion,
            at least one auxiliary gear disposed at a side of the bracket,
            a main gear cover covering the main gear, and
            an auxiliary gear cover covering the at least one auxiliary gear; and
    a battery disposed between the rear surface cover and an area of the flexible display that surrounds the rear surface of the bracket within the housing.

2. The electronic device of claim 1, wherein at least one electronic component of the electronic device that comprises the battery is disposed between the rear surface cover and the area of the flexible display that surrounds the rear surface of the bracket.

3. The electronic device of claim 1, wherein the bracket comprises a top surface facing a first direction and the rear surface faces a second direction opposite to the first direction, and
    the flexible display surrounds the top surface of the slide guide that faces the first direction, an outer surface of the rotary drive portion, and the portion of the rear surface of the bracket that faces the second direction.

4. The electronic device of claim 1, wherein the bracket further comprises a slide portion located adjacent to the rotary drive portion.

5. The electronic device of claim 4, wherein the rotary drive portion has a cylindrical shape and the slide part has a flat plate shape, and
    the cylindrical shape of the rotary drive portion has a diameter greater than a thickness of the slide portion.

6. The electronic device of claim 4, wherein a first edge of the slide portion adjacent to the rotary drive portion has a thickness greater than a thickness of another edge of the slide portion.

7. The electronic device of claim 4, wherein the slide portion comprises at least one guide groove configured to guide movement of the slide guide.

8. The electronic device of claim 4,
    wherein the main gear is configured to be coupled to the side surface of the rotary drive portion;
    wherein the at least one auxiliary gear is configured to be coupled to a side surface of the slide portion;
    wherein the main gear cover is configured to fix the main gear to the bracket; and
    wherein the auxiliary gear cover is configured to fix the at least one auxiliary gear to the bracket.

9. The electronic device of claim 8, wherein the display module further comprises multiple bars configured to support the flexible display and to guide movement of the flexible display.

10. The electronic device of claim 9, wherein a bump is disposed at an end of each of the multiple bars.

11. The electronic device of claim 10, wherein teeth of the main gear and teeth of the at least one auxiliary gear are disposed to be engaged with each of the bumps.

12. The electronic device of claim 10, wherein each bump has an oval shape or capsule shape, and
    areas of a respective bump adjacent to the teeth of the main gear and the teeth of the at least one auxiliary gear have a curved shape.

13. The electronic device of claim 10, wherein a protruding height of a respective bump from the end of each of the multiple bars is greater than a thickness of the main gear and a thickness of the at least one auxiliary gear.

14. The electronic device of claim 10, wherein each of the main gear cover and the auxiliary gear cover comprises at least one bent portion at an outer periphery thereof, and
    the at least one bent portion has a shape bent to restrain each of the bumps.

15. An electronic device comprising:
    a housing defining at least a portion of an exterior of the electronic device;
    a rear surface cover defining a rear surface of the electronic device;
    a display module seated in the housing, the display module comprising:
        a bracket comprising a rotary drive portion and a rear surface,
        a slide guide disposed on the bracket to be movable with respect to the rotary drive portion,
        a flexible display disposed to surround the top surface of the slide guide, the rotary drive portion, and a portion of the rear surface of the bracket, the flexible display comprising an inner surface,
            a main gear disposed at a side of the rotary drive portion,
            at least one auxiliary gear disposed at a side of the bracket,
            a main gear cover covering the main gear,
            an auxiliary gear cover covering the at least one auxiliary gear, and
            multiple bars attached to the inner surface of the flexible display to support the flexible display, the multiple bars configured to guide movement of the flexible display;

a printed circuit board disposed between the rear surface cover and an area of the flexible display that surrounds the rear surface of the bracket within the housing; and at least one gear disposed on a side surface of the bracket, wherein teeth of the at least one gear are engaged with a bump disposed on each of the multiple bars to drive the display module.

* * * * *